(12) United States Patent
Su et al.

(10) Patent No.: US 12,107,146 B2
(45) Date of Patent: Oct. 1, 2024

(54) SELF-ALIGNED AIR SPACERS AND METHODS FOR FORMING

(71) Applicant: TAIWAN SEMICONDUCTOR MANUFACTURING COMPANY, LTD., Hsinchu (TW)

(72) Inventors: Huan-Chieh Su, Hsinchu (TW); Jia-Chuan You, Hsinchu (TW); Cheng-Chi Chuang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 191 days.

(21) Appl. No.: 17/394,982

(22) Filed: Aug. 5, 2021

(65) Prior Publication Data
US 2023/0043669 A1 Feb. 9, 2023

(51) Int. Cl.
*H01L 21/8234* (2006.01)
*H01L 29/06* (2006.01)
*H01L 29/66* (2006.01)
*H01L 29/78* (2006.01)

(52) U.S. Cl.
CPC .......... *H01L 29/66545* (2013.01); *H01L 21/823418* (2013.01); *H01L 21/823431* (2013.01); *H01L 21/823481* (2013.01); *H01L 29/0649* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2014/0264480 A1* | 9/2014 | Tsao | H01L 29/7843 438/303 |
| 2015/0278429 A1 | 10/2015 | Chang | |
| 2020/0091345 A1* | 3/2020 | Chiu | H01L 29/7851 |

\* cited by examiner

*Primary Examiner* — Joseph C. Nicely
*Assistant Examiner* — Lamont B Koo
(74) *Attorney, Agent, or Firm* — Hauptman Ham, LLP

(57) ABSTRACT

A method of manufacturing an integrated circuit device including a self-aligned air spacer including the operations of forming a dummy gate, forming a sidewall on the dummy gate, forming a dummy layer on the sidewall, constructing a gate structure within an opening defined by the sidewall, removing at least a portion of the first dummy layer to form a first recess between the sidewall layer and the dummy gate, and capping the first recess to form a first air spacer.

20 Claims, 22 Drawing Sheets

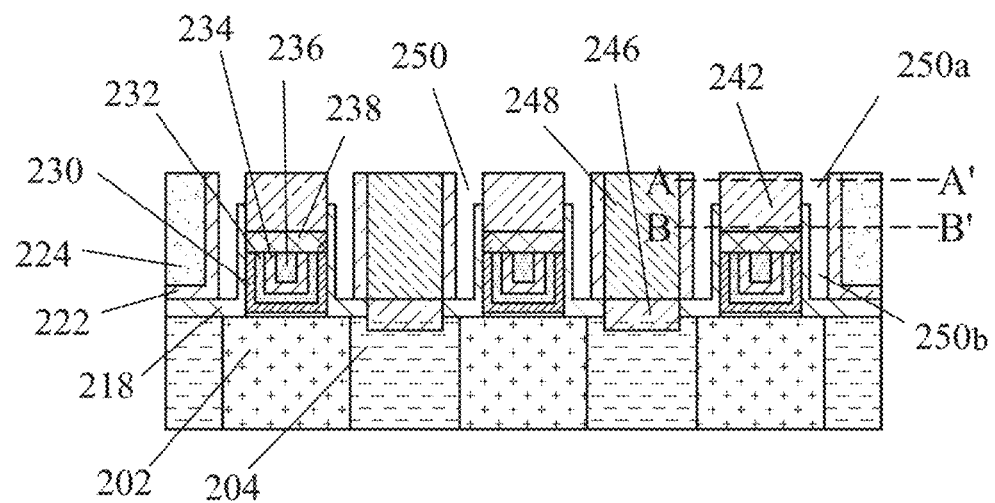
FIG. 2S
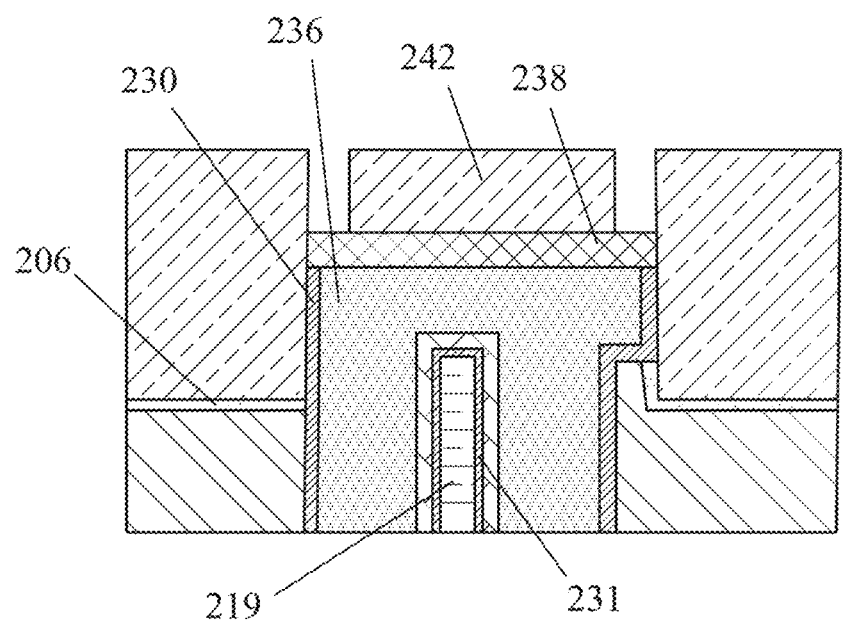
FIG. 2S$_y$

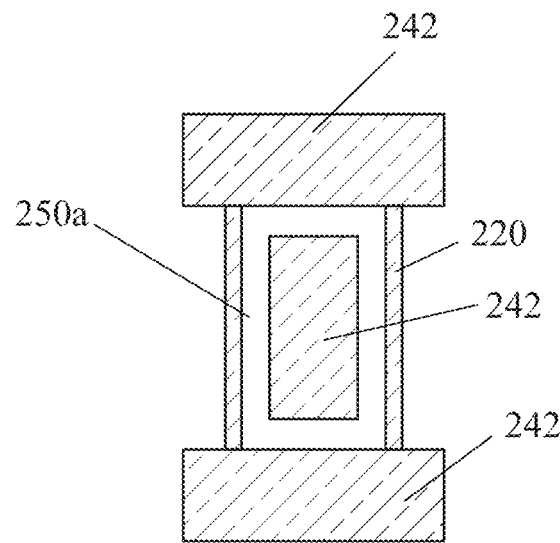
FIG. 2S$_{ZA}$
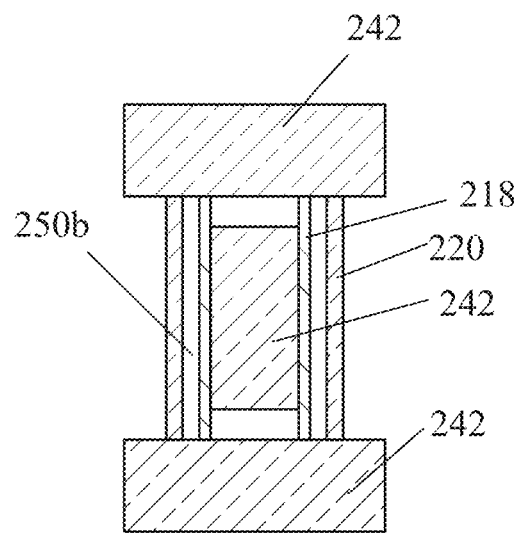
FIG. 2S$_{ZB}$

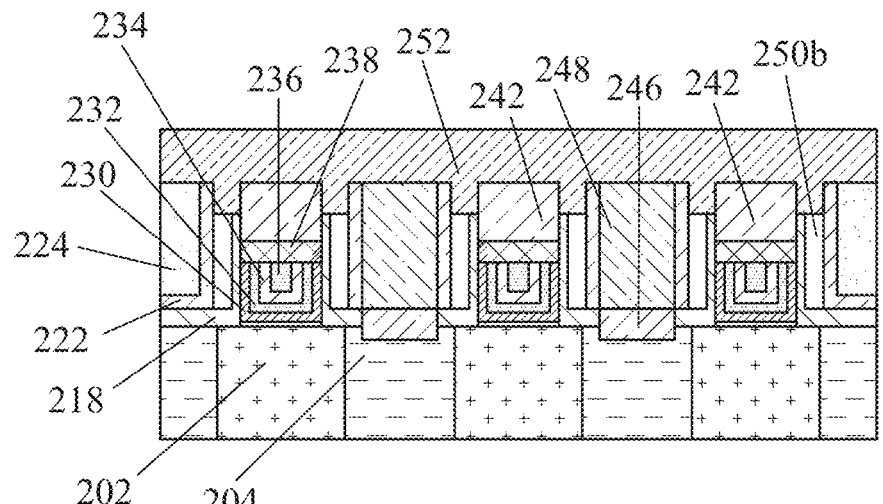
FIG. 2T
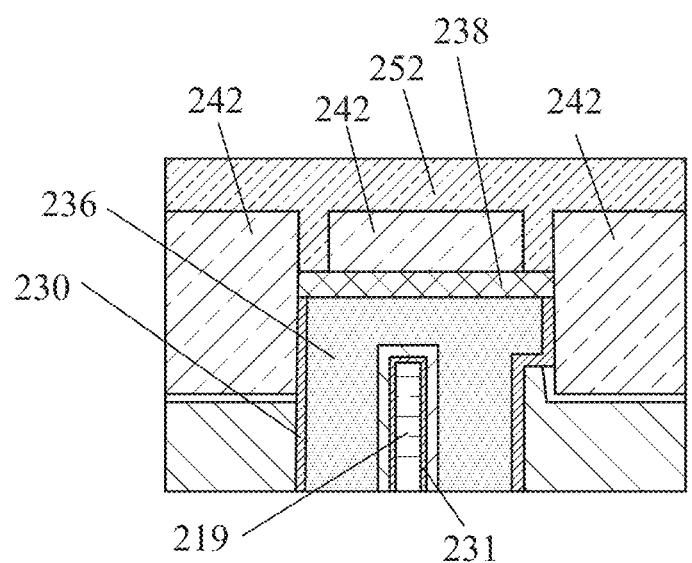
FIG. 2T$_y$

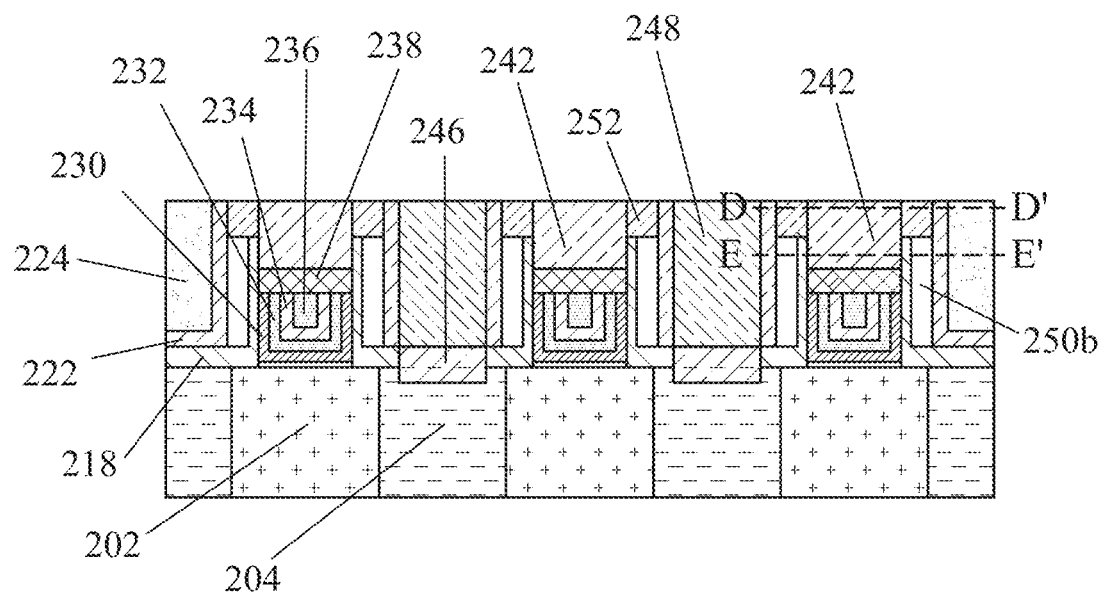
FIG. 2U
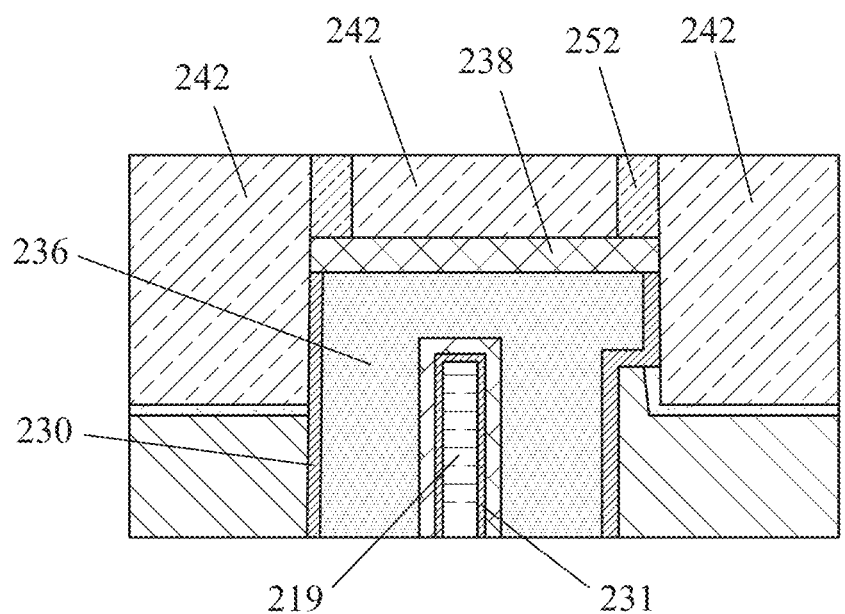
FIG. 2U_y

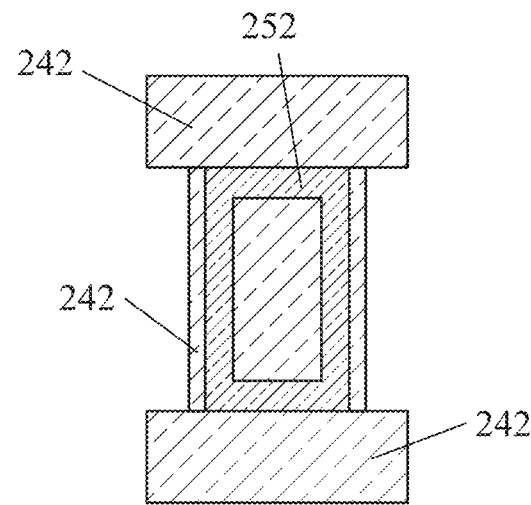
FIG. 2U_{ZD}
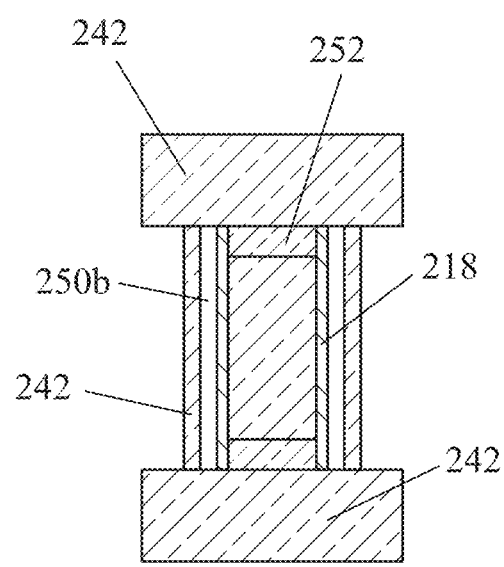
FIG. 2U_{ZE}

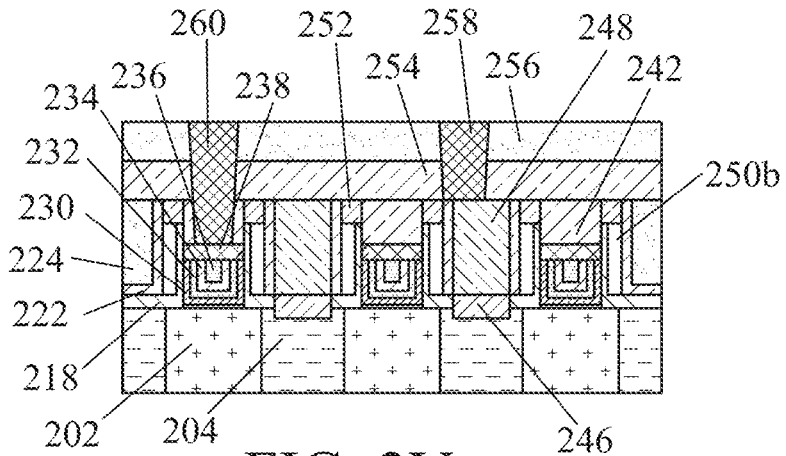
FIG. 2V
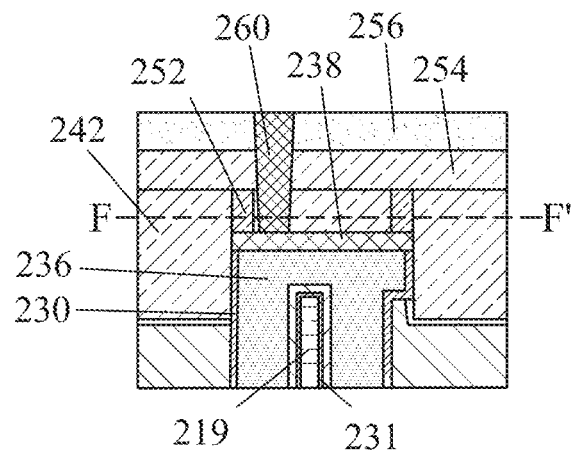
FIG. 2V$_y$
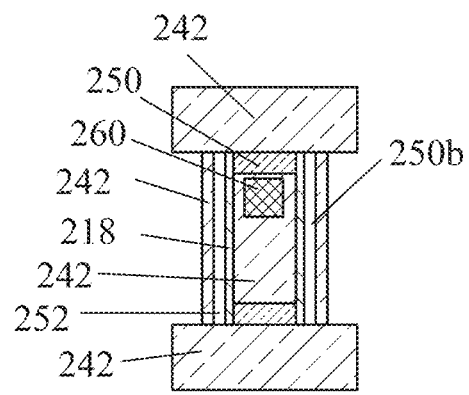
FIG. 2V$_{ZF}$

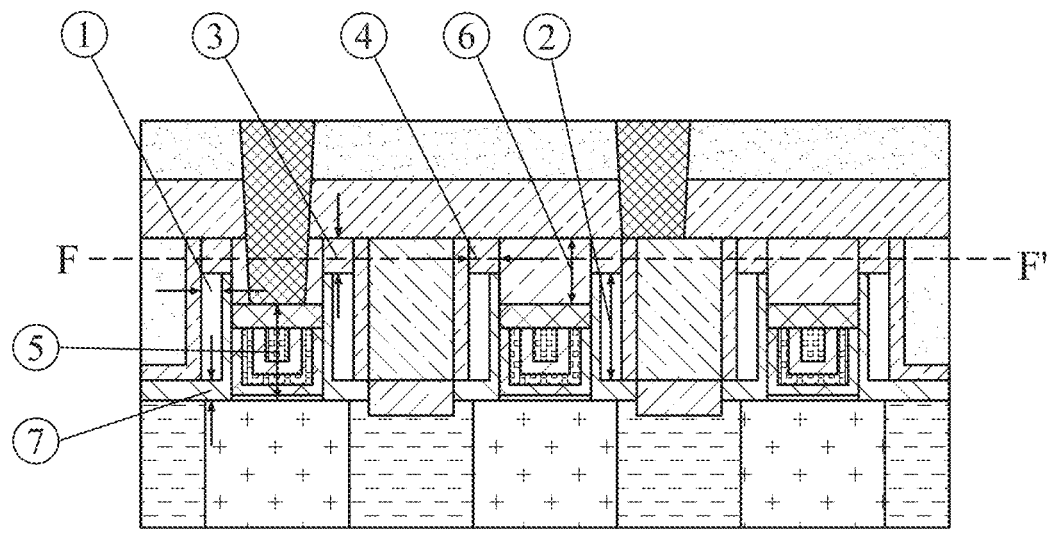
FIG. 7A
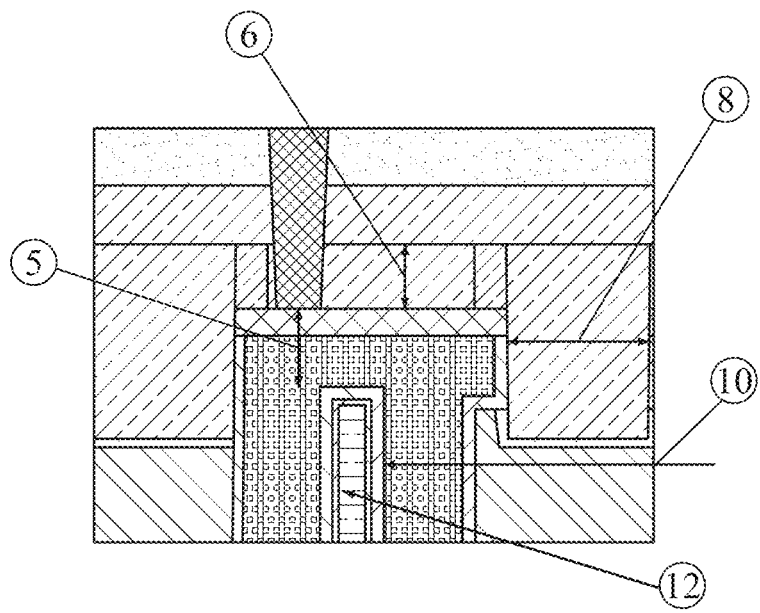
FIG. 7B$_y$

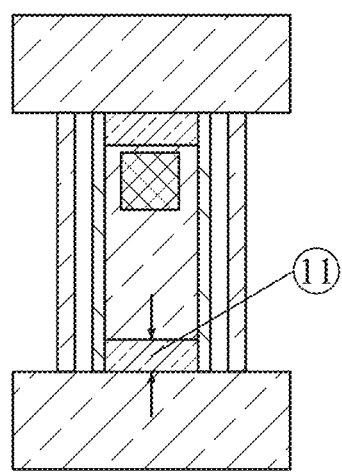
FIG. 7C$_{ZF}$

SELF-ALIGNED AIR SPACERS AND METHODS FOR FORMING

BACKGROUND

Semiconductor devices are used in a variety of electronic applications, such as personal computers, cell phones, digital cameras, and other electronic equipment. Many semiconductor devices are fabricated by sequentially depositing insulating or dielectric layers, conductive layers, and semiconductor layers of material over a semiconductor substrate, and patterning the various material layers using lithography to form circuit components and elements thereon. As the semiconductor industry has progressed into smaller technology process nodes in pursuit of higher device density, higher performance, and lower costs, challenges from both fabrication and design issues have resulted in the development of three-dimensional designs.

The semiconductor integrated circuit (IC) industry has experienced rapid growth. Technological advances in IC materials and design have produced generations of ICs with each generation having smaller and more complex circuits than the previous generation. However, the semiconductor industry progression into smaller technology process nodes has resulted in the development of three-dimensional designs including, for example, fin field effect transistors (FinFET) and Gate-All-Around (GAA) devices.

Although advantages of the FinFET include reducing short channel effects and increasing current flow, the associated fabrication processes continue to become more challenging as the feature sizes and spacing continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7CZF are cross-sectional views of a FinFET device structure at an intermediate manufacturing step according to some embodiments.

DETAILED DESCRIPTION

Figure 1A:
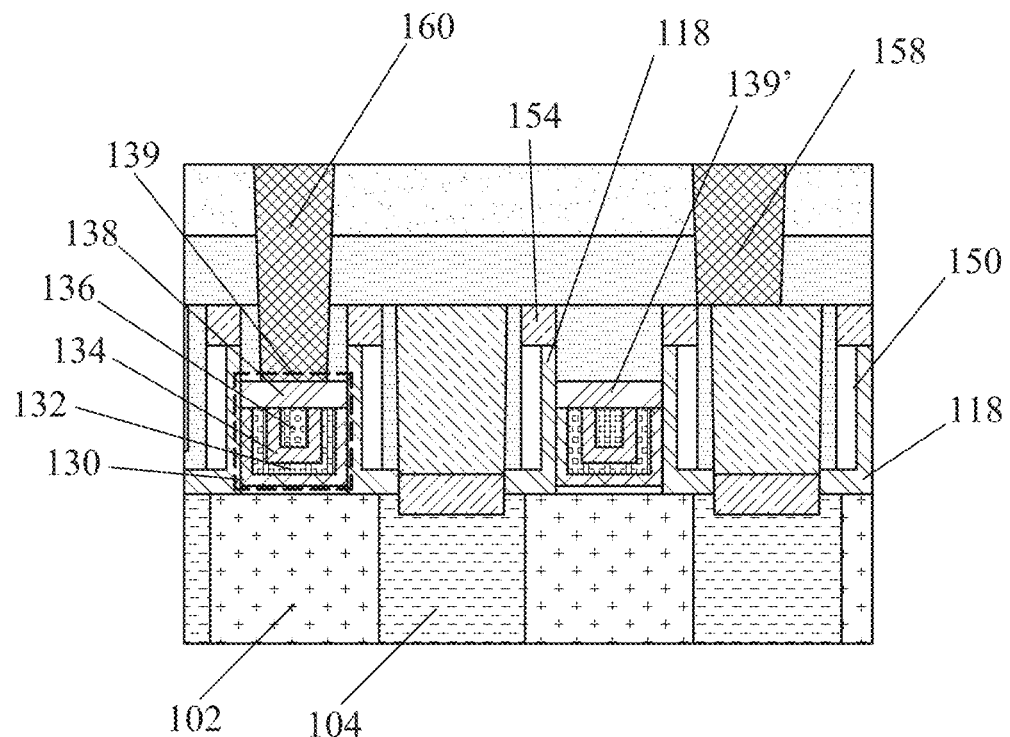
FIG. 1A is a cross-sectional view of a FinFET device structure according to some embodiments.

This description of the exemplary embodiments is intended to be read in connection with the accompanying drawings, which are to be considered part of the entire written description. The following disclosure provides many different embodiments, or examples, for implementing different features of the provided subject matter. The drawings are not to scale and the relative sizing and placement of structures have been modified for clarity rather than dimensional accuracy. Specific examples of components, values, operations, materials, arrangements, or the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to the structures, designs, and manufacturing methods for IC devices, including fin field effect transistor (FinFET) devices. Although the structures and methods are discussed in terms of FinFET devices, the structures and methods are not so limited and are suitable for inclusion in manufacturing processes for other classes of IC devices. Similarly, the structures and methods are not so limited and are suitable for inclusion in manufacturing processes for IC devices in which one or more of the fin structures is replaced by a plurality of nanosheets and/or nanowires.

In FinFET devices, the performance is influenced by both the uniformity of the gate structures the associated capacitance exhibited by such structures, which, in turn, are dependent on factors including the profile of the gate structures and the dielectric materials provided adjacent the gate structures. Embodiments of the disclosed methods, by providing both improved control of the gate structure uniformity and reduced capacitance will tend to reduce manufacturing defects while improving device yield and performance.

In particular, the difficulty in maintaining uniformity in the sizing of the gate structures during formation of self-aligned air spacer (SAAS) openings subsequent to a metal gate etch back (MGEB) process will tend to increase the likelihood that the resulting IC structures will exhibit wider performance variability. Variability in the performance of the resulting IC structures will tend to decrease production yield and/or result in IC devices unable to meet premium device parameters and reducing the commercial value of such devices.

FIG. 1A is a cross-sectional view of a FinFET device structure manufactured on a semiconductor substrate comprising both gate 102 and source/drain regions 104 according to some embodiments in which an initial metal pattern has been formed on the device structure with gate contacts 160 for applying operational signals to the gate structures 139 (comprising a composite structure including a backside anti-reflection coating 130, a conductive sidewall layer 132, a conductive etch back layer 134, a conductive fill layer 136, and a conductive cap layer 138) and/or source/drain (S/D) contacts 158 for applying voltage(s) to the source/drain (S/D) regions 104. Manufacturing the gate structures of gate I 139 and gate II 139' according to some embodiments produces gate structures having similar configurations, particularly with respect to the overall height of the gate structures 139, 139'.

In FIG. 1A, each of the gate structures 139, 139' is bracketed by both an L-shaped spacer 118 and a self-aligned air spacer 150, with the air spacer tending to lower the total capacitance ($C_{tot}$) of the gate structure 139, 139' relative to the total capacitance that would result if a solid or porous dielectric material were to be used to fill the same space occupied by the self-aligned air spacer 150. By utilizing the self-aligned air spacer 150, which is sealed by a plug structure 154, rather than the practice according to another approach of using a layer of a solid dielectric material, adjacent an L-shaped spacer 118 formed from a low-κ (LK) material, the FinFET device structure of FIG. 1A provides a device having lower total capacitance ($C_{tot}$) and improving at least some aspects of device performance. Further, by utilizing the manufacturing steps according to some embodiments as outlined below in connection with FIGS. 2A-2V$_{zF}$, the resulting IC device tends to improve the structural uniformity among the gate structures 139, 139'. The more uniform gate structures 139, 139' manufactured according to some embodiments tend to exhibit improved uniformity in transistor parametric values over other approach constructions in which the gate structures exhibited a wider dimensional range, particularly with respect to height.

Figure 1B:
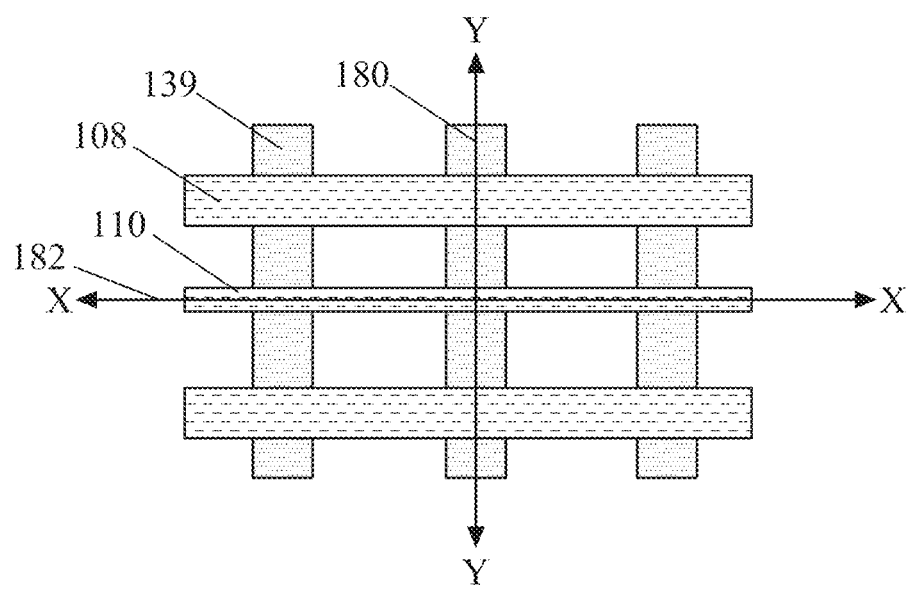
FIG. 1B is a simplified plan view of a FinFET device structure according to some embodiments indicating the X and Y planes along which cross-sections are taken according to some embodiments.

FIG. 1B is a simplified plan view of a FinFET device structure at an intermediate manufacturing step according to some embodiments indicating the positioning of the x-plane 180 and y-plane 182 relative to other structures including an active region 110, a gate structure 139, and a dielectric fin structure 108 for cutting the gate structure 139. The x-plane and y-plane are used for defining the positions along which the various cross-sections shown in subsequent figures are taken according to some embodiments.

Figure 2A:
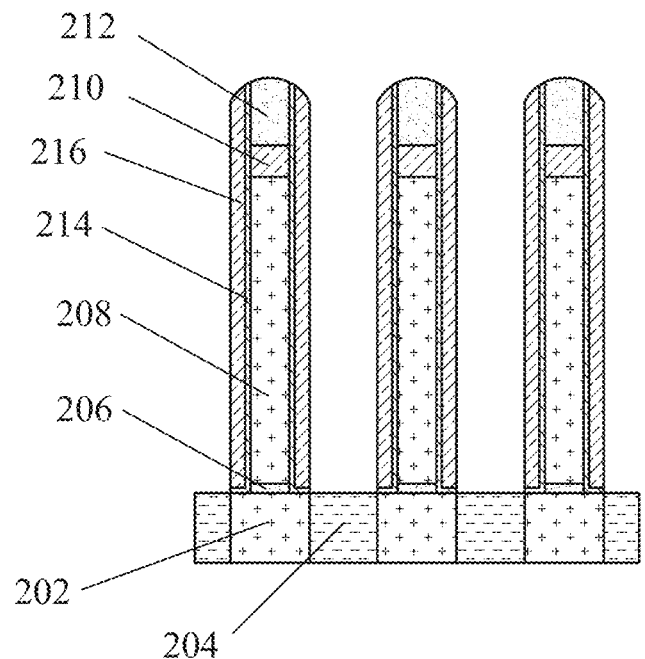
FIGS. 2A through 2A-2VZF are cross-sectional views of FinFET device structures at various intermediate manufacturing steps according to some embodiments.

FIG. 2A is a cross-sectional view of a FinFET device structure at an intermediate manufacturing step according to some embodiments in which active regions have been defined on a surface of a wafer using, for example, a shallow trench isolation (STI) method. The active region is then separated into gate regions 202 of the substrate and source/drain regions 204 (SD) defined within the active region 110 (FIG. 1B) that, in some embodiments, are formed by using a removal process to form openings and then growing an epitaxial semiconductor material (EPI) to fill the openings. The source/drain regions 204 are bounded by dummy gate structures initially comprising a barrier material 206, e.g., silicon oxide, a dummy gate material 208, e.g., polysilicon, a mask (hard mask) formed on the upper surface of the dummy gate material 208. In some embodiments, the hard mask will comprise a first mask layer 210 and a second mask layer 212. In some embodiments, a first sidewall layer 214 is then formed on the dummy gate material 208 and the first and second mask layers 210, 212, and a second sidewall layer 216, e.g., a low-κ dielectric material (where κ<4.0), is formed on the first sidewall material.

Figure 2B:
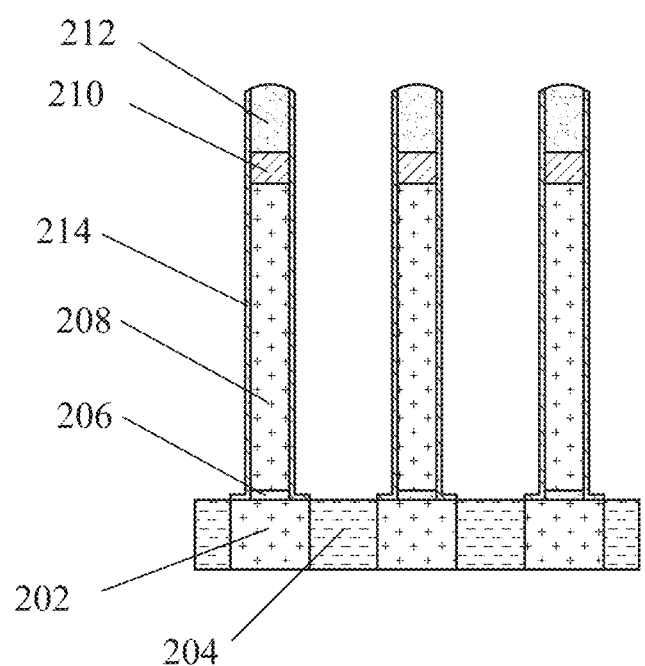

FIG. 2B is a cross-sectional view of a FinFET device structure at an intermediate manufacturing step subsequent to that shown in FIG. 2A according to some embodiments in which the second sidewall layer 216 has been removed from the fins using a selective etch to expose the first sidewall layer 214.

Figure 2C:
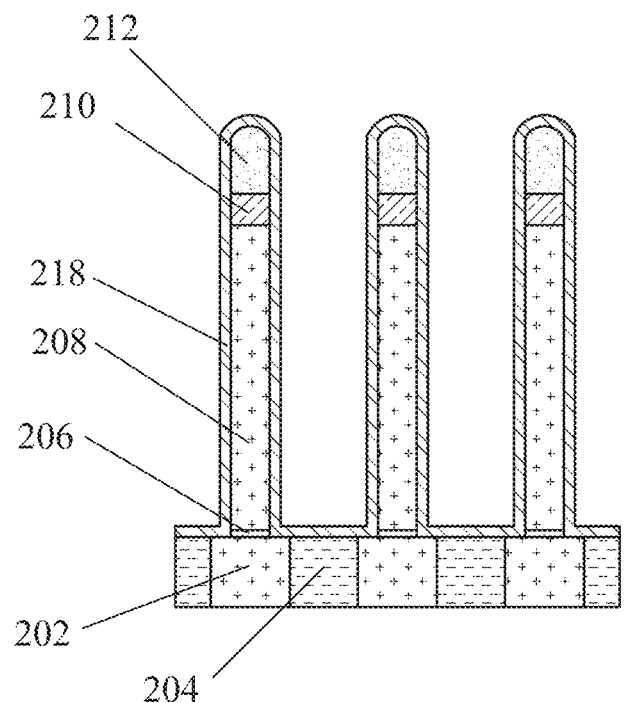

FIG. 2C is a cross-sectional view of a FinFET device structure at an intermediate manufacturing step subsequent to that shown in FIG. 2B according to some embodiments in which the first sidewall material 214 has been removed from the fins using a selective etch and a third sidewall layer 218, e.g., a low-κ dielectric material, has been deposited on the dummy gate and the hard mask. The third sidewall layer 218 is a continuous layer over each of the dummy gate structures and between adjacent dummy gate structures. The low-κ materials used in forming the second and third sidewall layers 216, 218, are the same low-κ material or different low-κ materials. In some embodiments, the third sidewall layer is deposited during chemical vapor deposition (CVD) or another suitable deposition process.

Figure 2D:
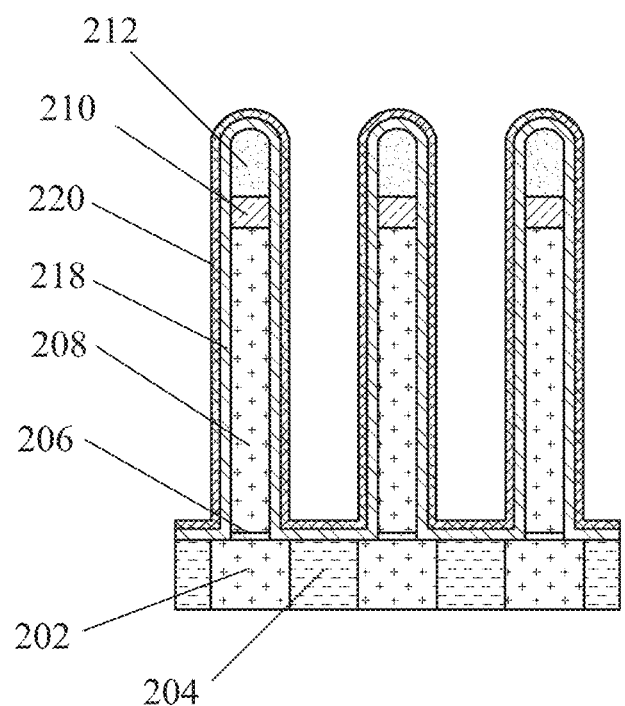

FIG. 2D is a cross-sectional view of a FinFET device structure at an intermediate manufacturing step subsequent to that shown in FIG. 2C. According to some embodiments, the FinFET structure of FIG. 2C has been modified with the deposition of a layer of material comprising the first dummy layer 220 on the third sidewall layer 218. The material comprising the first dummy layer 220 is a continuous layer over each of the dummy gate structures and between adjacent dummy gate structures. In some embodiments, the material comprising the first dummy layer 220 is deposited by CVD or another suitable deposition process.

Figure 2E:
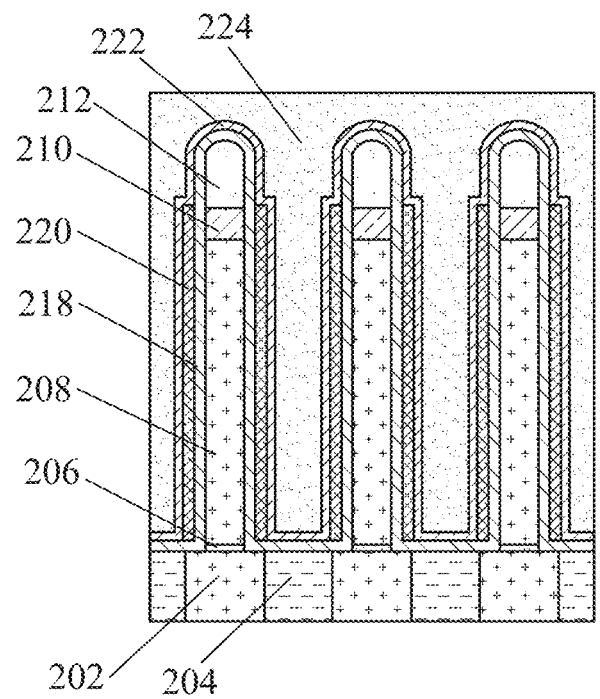

FIG. 2E is a cross-sectional view of a FinFET device structure at an intermediate manufacturing step subsequent to that shown in FIG. 2D according to some embodiments in which the first dummy layer 220 is partially removed, using an etchback process, from an upper portion of the fin and from a region above the S/D regions 204. After partially removing the first dummy layer 220, a bottom contact etch stop layer 222 (BCESL) material is deposited on the exposed surfaces of the remaining structure, for example using CVD or another suitable deposition process. A first interlayer dielectric (ILD) layer 224 is then deposited on the BCESL 222, the thickness of the first ILD layer 224 being sufficient to cover the dummy gate structures and fill the spaces between the dummy gate structures.

Figure 2F:
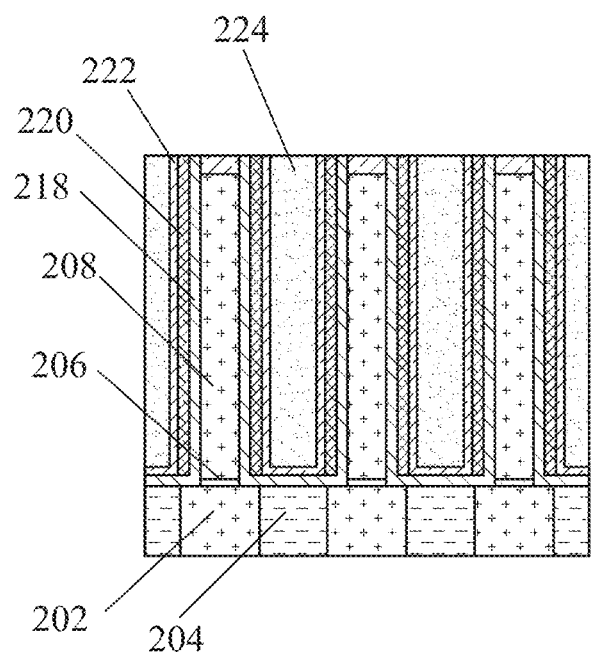

FIG. 2F is a cross-sectional view of a FinFET device structure at an intermediate manufacturing step subsequent to that shown in FIG. 2E according to some embodiments after a chemical mechanical polishing (CMP) operation, or other suitable operation, has been applied to the wafer. The CMP operation is conducted under conditions and for a period sufficient to remove an upper portion of the first ILD layer 224, an entirety of the second mask layer 212, and an upper portion of the first mask layer 210. In some embodiments in which the first and second mask layers 210, 212 materials are different, the first mask layer 210 includes a material that is more resistant to the conditions of the CMP process used to remove the second mask layer 212 and is usable for endpoint monitoring during the CMP process.

Figure 2G:
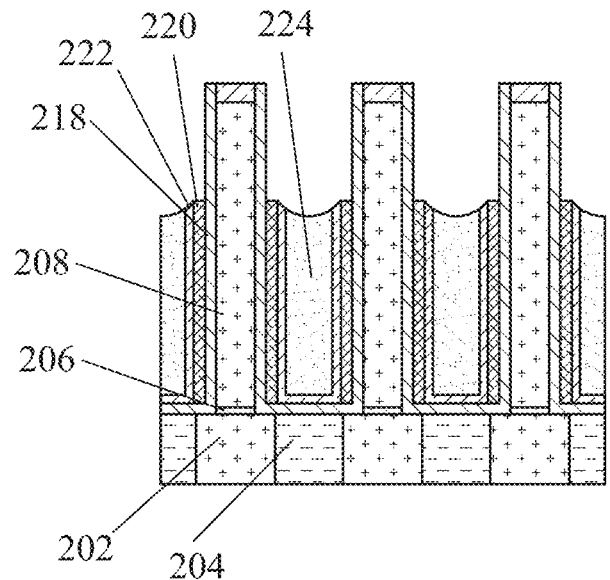

FIG. 2G is a cross-sectional view of a FinFET device structure at an intermediate manufacturing step subsequent to that shown in FIG. 2F according to some embodiments. In FIG. 2G an etch process is utilized for removing an intermediate portion of the first ILD layer 224 below the top surface of the fin, an intermediate portion of the third sidewall layer 218, and an intermediate portion of the first dummy layer 220. In some embodiments, the etch process produces dishing within the first ILD layer 224, the third sidewall layer 218 and the material comprising the first dummy layer 220.

Figure 2H:
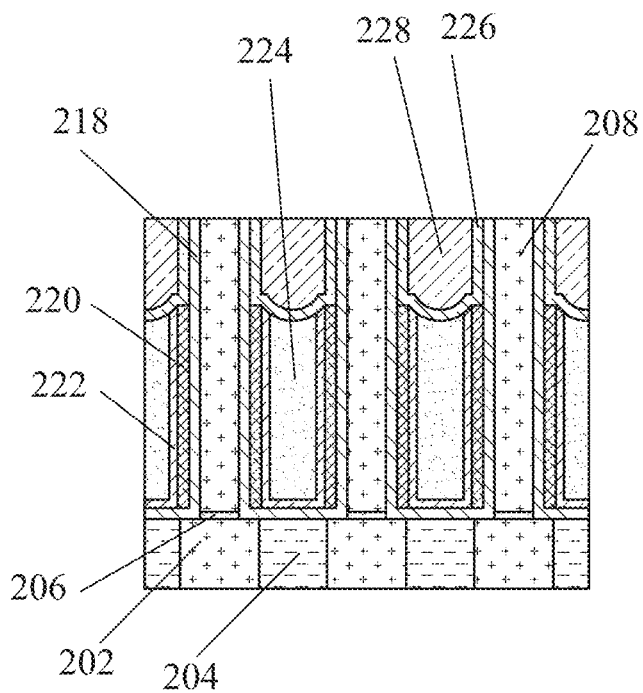

FIG. 2H is a cross-sectional view of a FinFET device structure at an intermediate manufacturing step subsequent to that shown in FIG. 2G according to some embodiments in which an optional liner layer 226 and/or a third mask layer 228, e.g., a silicon nitride layer, is/are deposited on the residual surfaces of the wafer. A chemical mechanical polishing (CMP) operation, or other suitable operation, is then applied to the wafer under conditions and for a period sufficient to remove an upper portion of the liner layer 226 (if present), the third mask layer 228, and/or a residual portion of the first mask layer 210, thereby exposing an upper surface of the dummy gate material 208.

Figure 2I:
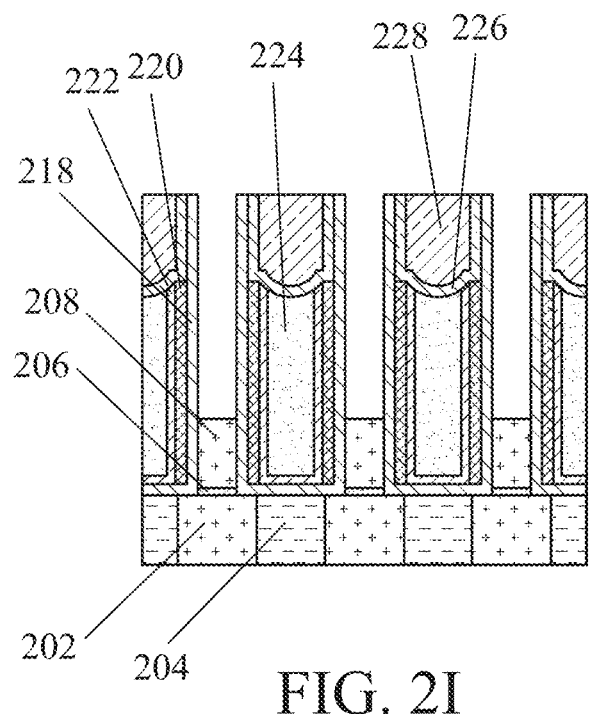

FIG. 2I is a cross-sectional view of a FinFET device structure at an intermediate manufacturing step subsequent to that shown in FIG. 2H according to some embodiments. In FIG. 2I an etching process is performed using the third mask layer 228 to remove an upper portion of the dummy gate material 208. In some embodiments, the etching process is a wet etching process. In some embodiments, the etching process is a dry etching process.

Figure 2J:
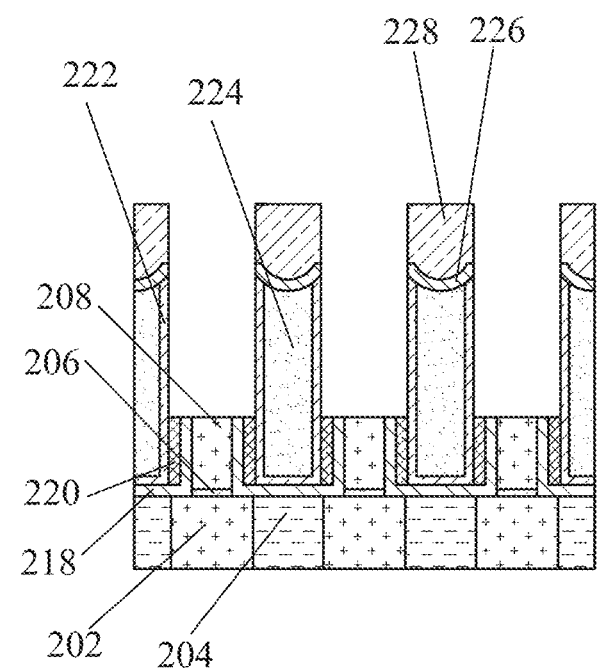

FIG. 2J is a cross-sectional view of a FinFET device structure at an intermediate manufacturing step subsequent to that shown in FIG. 2I according to some embodiments. In FIG. 2J an etching process is performed to remove portions of the both the third sidewall layer 218 and the first dummy layer 220. In some embodiments, the etch process is conducted under conditions and for a period sufficient whereby topmost surfaces of the residual portions of the third sidewall layer 218 and the first dummy layer 220 are generally co-planar with a topmost surface of the residual portion of the dummy gate material 208. In some embodiments, the etching process is a wet etching process. In some embodiments, the etching process is a dry etching process.

Figure 2K:
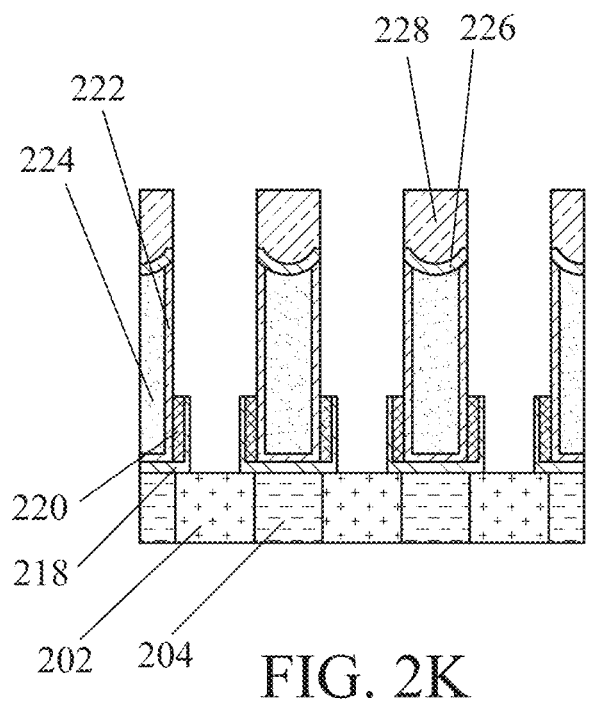

FIG. 2K is a cross-sectional view of a FinFET device structure at an intermediate manufacturing step subsequent to that shown in FIG. 2J according to some embodiments. In FIG. 2K an etching process is performed to remove both the residual portion of the dummy gate material 208 and the barrier material 206 while leaving at least the majority of the residual portions of the third sidewall layer 218 and the first dummy layer 220 remaining on the FinFET device structure of FIG. 2J. The gate region 202 of the substrate is exposed between the residual portions of the third sidewall layer 218 and the material comprising the first dummy layer 220. In some embodiments, the etching process is a wet etching process. In some embodiments, the etching process is a dry etching process. The etching processes mentioned in various steps have etchants and conditions selected based on the amount of type of material to be removed by the etching process.

Figure 2L:
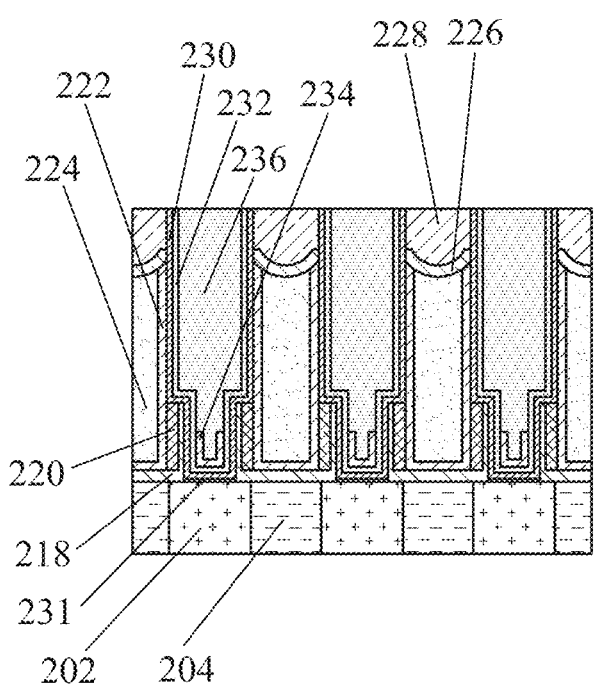

FIG. 2L is a cross-sectional view of a FinFET device structure at an intermediate manufacturing step subsequent to that shown in FIG. 2K according to some embodiments. In FIG. 2L certain conductive layers, portions of which will be incorporated into a multi-pattern gate (MPG) structure, are formed on a gate dielectric 231 including, for example, a backside anti-reflection coating 230 (BARC), a conductive sidewall layer 232, a conductive etch back layer 234, and a conductive fill layer 236. The conductive fill layer 236 fills the remainder of an opening defined by the process steps used to remove material as indicated in FIGS. 2I-K and the preceding deposition steps. A chemical mechanical polishing (CMP) operation, or other suitable operation, is then applied to the wafer under conditions and for a period sufficient to remove the initial materials of the MPG over the third mask layer 228.

Figure 2M:
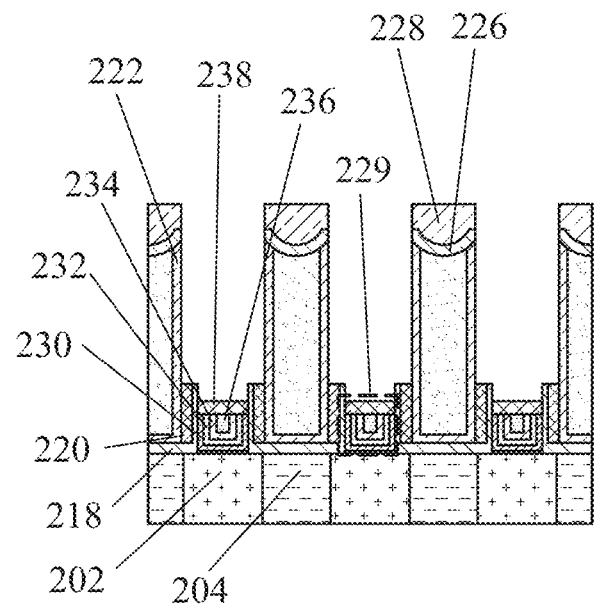

FIG. 2M is a cross-sectional view of a FinFET device structure at an intermediate manufacturing step subsequent to that shown in FIG. 2L according to some embodiments. In FIG. 2M the initial materials of the MPG structure is etched, or etched back, to remove upper portions of the BARC 230, the conductive sidewall layer 232, the conductive etch back layer 234, and the conductive fill layer 236. In some embodiments, the etch back layer 234 is utilized for determining the endpoint of the etch. In some embodiments, a conductive cap layer 238 is formed to cover the residual portions of the initial materials to complete the formation of the MPG 229. In some embodiments, the cap layer 238 is formed using CVD or another suitable deposition process. In some embodiments, the etch process is configured so that the upper surfaces of the residual portions of the MPG 229 are recessed relative to the residual portions of the third sidewall layer 218 and the first dummy layer 220.

Figure 2N:
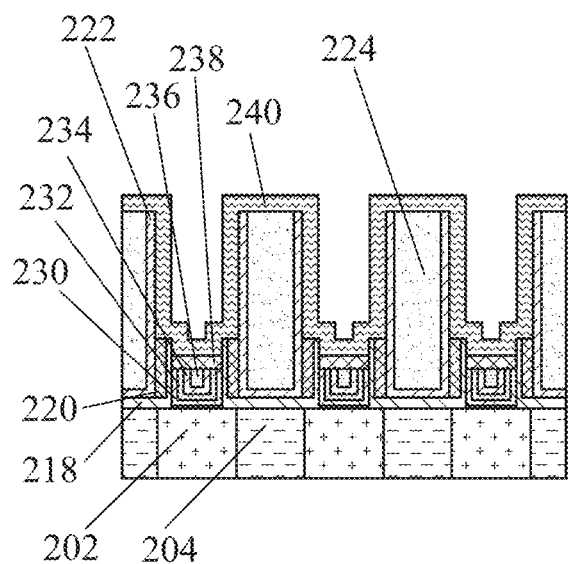

FIG. 2N is a cross-sectional view of a FinFET device structure at an intermediate manufacturing step subsequent to that shown in FIG. 2M according to some embodiments. The liner layer 226 (if present) and/or the third mask layer 228 have been removed, for example by an etching process. A second dummy layer 240 has been deposited. The second dummy layer 240 is a continuous layer extending across the entire structure. In some embodiments, the second dummy layer 240 is deposited using CVD or another suitable deposition process.

Figure 2O:
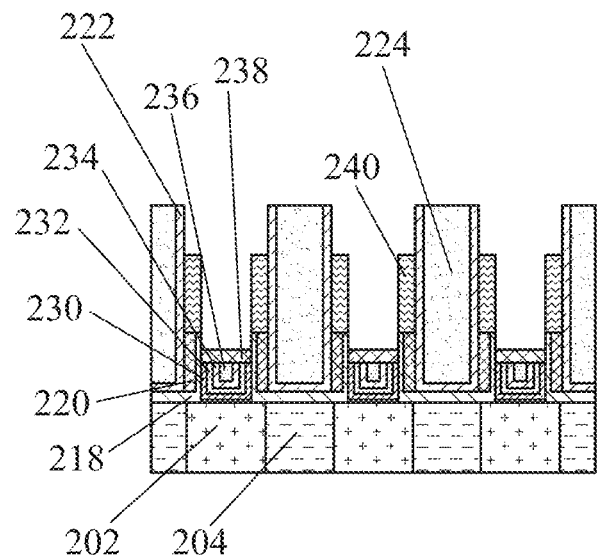

FIG. 2O is a cross-sectional view of a FinFET device structure at an intermediate manufacturing step subsequent to that shown in FIG. 2N according to some embodiments. In FIG. 2O the second dummy layer 240 is etched back to remove upper portions of the second dummy layer 240 whereby a top surface of the second dummy layer 240 is recessed relative to the upper surface of the residual portion of the first ILD layer 224 and the cap layer 238 is exposed over the MPG 229. In some embodiments, the second dummy layer 240 has a thickness greater than the first dummy layer 220 and, in some embodiments, has a thickness similar to a sum of the thicknesses of the third sidewall layer 218 and first dummy layer 220.

Figure 2P:
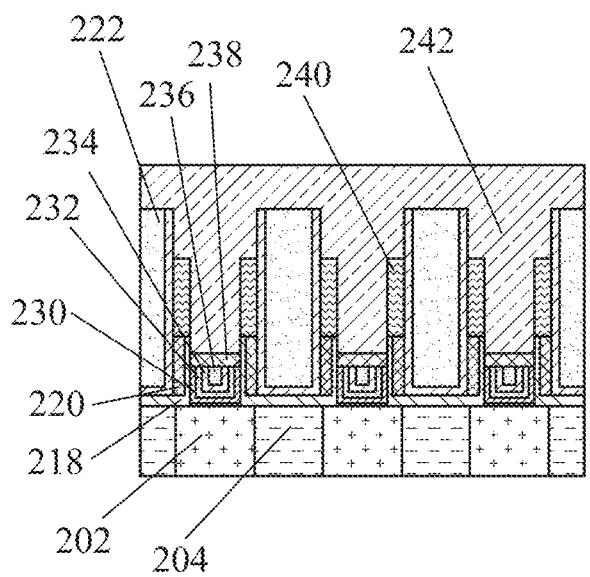

FIG. 2P is a cross-sectional view of a FinFET device structure at an intermediate manufacturing step subsequent to that shown in FIG. 2O according to some embodiments. A self-aligned contact layer 242 (SAC1) is deposited on the wafer, the thickness of the SAC1 242 is sufficient to cover the upper surface of the residual portion of the first ILD layer 224 and fill the opening above the MPG 229.

Figure 2Q:
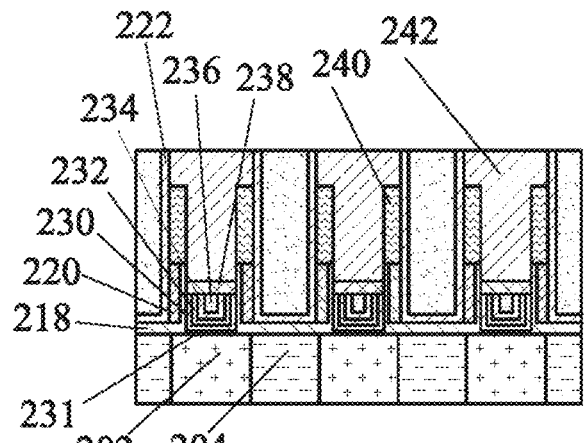
Figure 2Q:
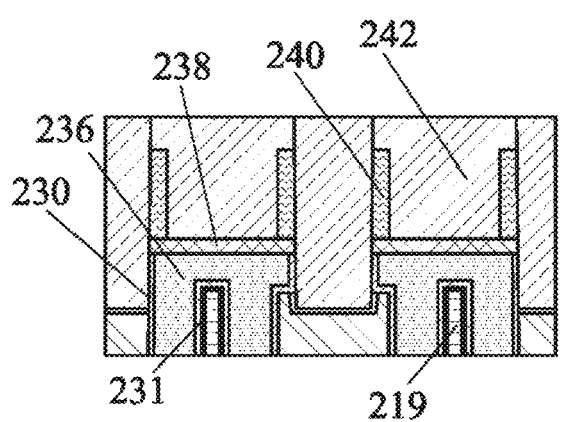

FIG. 2Q is a cross-sectional view of a FinFET device structure at an intermediate manufacturing step subsequent to that shown in FIG. 2P according to some embodiments. In FIG. 2Q the SAC1 242 is subjected to a CMP process, etch back, or other suitable planarizing operation for removing upper portions of the SAC1 242 to expose the first ILD layer 224. FIG. 2Q is a cross-sectional view taken along an x-plane, e.g., as indicated in FIG. 1B, of the FinFET device structure.

FIG. 2Qy is a cross-sectional view of a FinFET device structure taken along the y-plane, e.g., as indicated in FIG. 1B, at an intermediate manufacturing step corresponding to FIG. 2Q (FIG. 2Q being the default x-plane cross-sectional view). FIG. 2Qy illustrates structures not visible in FIG. 2Q including the fin 219 of a FinFET device, the gate dielectric 231 formed on the fin, and the relationship between the fin 219 and the conductive fill layer 236.

Figure 2R:
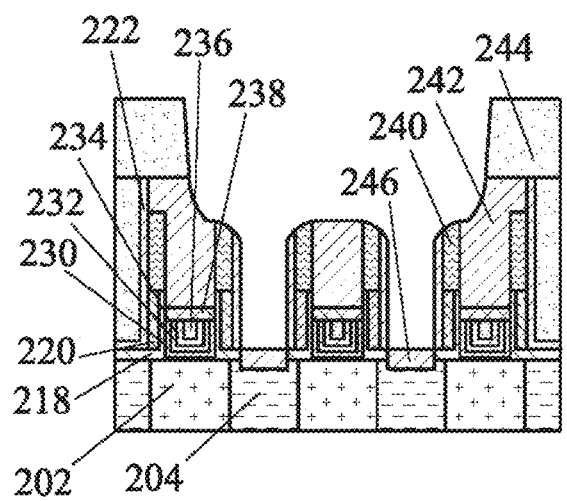

FIG. 2R is a cross-sectional view of a FinFET device structure at an intermediate manufacturing step subsequent to that shown in FIG. 2Q according to some embodiments. In FIG. 2R a fourth hard mask 244, e.g., silicon nitride, has been applied to the wafer and the exposed regions etched. In some embodiments, the etch process is conducted under conditions and for a period sufficient whereby the residual portions of the first ILD layer 224 that are exposed by the fourth hard mask 244 are removed to expose upper surfaces of the source/drain regions 204. In some embodiments, the etch process is conducted under conditions and for a period sufficient whereby upper portions of the SAC1 242 that are exposed by the fourth hard mask 244 are removed. In some embodiments, the exposed upper surfaces of the source/drain regions 204 are treated to form a suicide region 246 (or salicide region) on the source/drain regions 204.

FIG. 2S is a cross-sectional view of a FinFET device structure at an intermediate manufacturing step subsequent to that shown in FIG. 2R according to some embodiments. A via metal layer (not shown), which, in some embodiments, includes a plurality of metals and alloys, has been deposited on the wafer and then subjected to a CMP process, or other suitable method, to remove an upper portion of the via metal layer leaving portions to the metal layer to form conductive vias 248. The conductive vias 248 provide a portion of the electrical connection between the front end of line (FEOL) elements and the metal pattern layers (not shown) added during back end of line (BEOL) processing that will establish the functional connections on the completed IC device. After removing the upper portion of the via metal layer, an upper surface of the second dummy layer 240 are exposed, thereby allowing the second dummy layer 240 and the underlying first dummy layer 220 to be removed as well, for example, using an etching process. Removing the first and second dummy layers leaves a two-zone opening 250. The opening has a wider upper opening portion 250a left by removing the second dummy layer 240 and a narrower lower opening portion 250b left by removing the first dummy layer 220.

FIG. $2S_y$ is a cross-sectional view of a FinFET device structure taken along a y-plane at an intermediate manufacturing step corresponding to FIG. 2S (FIG. 2S being the default x-plane cross-sectional view). FIG. $2S_y$ illustrates structures not visible in FIG. 2S including the fin 219, the gate dielectric 231 formed on the fin, and the relationship between the fin 219 and the conductive fill layer 236.

FIG. $2S_{zA}$ is a cross-sectional view of a FinFET device structure taken along a z-plane (a horizontal plane containing the line A-A' in FIG. 2S) at an intermediate manufacturing step. As a result of the positioning of the z-plane for FIG. $2S_{zA}$, the wider upper opening portion 250a left by removing the second dummy layer 240 is revealed.

FIG. $2S_{zB}$ is a cross-sectional view of a FinFET device structure taken along a z-plane (a horizontal plane containing the line B-B' in FIG. 2S) at an intermediate manufacturing step. As a result of the positioning of the z-plane for FIG. $2S_{zB}$, the narrower lower opening portion 250b left by removing the first dummy layer 220, and the third sidewall layer 218 are revealed. In some embodiments, the ratio of the width of the narrower lower opening portion 250b to the width of the third sidewall layer 218 will be adjusted by controlling the relative thicknesses of the first dummy layer 220 and the third sidewall layer 218 thereby providing a method for adjusting the resulting total capacitance.

FIG. 2T is a cross-sectional view of a FinFET device structure at an intermediate manufacturing step subsequent to that shown in FIG. 2S according to some embodiments. A layer of material that is used in forming the cap, seal, or plug structure 252, has been deposited on the wafer, for example by CVD or another suitable deposition process. The deposition of the seal material layer is under such conditions that the material is limited primarily to the upper opening portion 250a of the two-zone opening 250, thereby leaving the narrower lower opening portion 250b filled with the ambient gas under the plug structure 252 material layer providing an air space having a κ-value of about 1 and lowering the capacitance of the gate structure. In some embodiments, a portion of the plug structure 252 extends into the lower opening portion 250b. In some embodiments, the portion of the plug structure 252 extending into the lower opening portion 250b includes a curved or tapered profile. In some embodiments, the portion of the plug structure 252 extending into the lower opening portion 250b does not extend below a plane defined by the top surface of the cap layer 238.

FIG. $2T_y$ is a cross-sectional view of a FinFET device structure taken along a y-plane at an intermediate manufacturing step corresponding to FIG. 2T (FIG. 2T being the default x-plane cross-sectional view). FIG. $2T_y$ illustrates structures not visible in FIG. 2T including the fin 219, the gate dielectric 231 formed on the fin, and the relationship between the fin 219 and the conductive fill layer 236.

FIG. 2U is a cross-sectional view of a FinFET device structure at an intermediate manufacturing step subsequent to that shown in FIG. 2T according to some embodiments. In FIG. 2U, the plug structure 252 material layer has been subjected to a CMP process, or other suitable method, to remove an upper portion of the plug structure 252 material layer leaving minor portions of the plug structure 252 material layer to form plugs above the lower opening portion 250b of the two-zone opening 250.

FIG. $2U_y$ is a cross-sectional view of a FinFET device structure taken along a y-plane at an intermediate manufacturing step corresponding to FIG. 2U (FIG. 2U being the default x-plane cross-sectional view). FIG. $2U_y$ illustrates structures not visible in FIG. 2U including the fin 219, the gate dielectric 231 formed on the fin, and the relationship between the fin 219 and the conductive fill layer 236.

FIG. $2U_{zD}$ is a cross-sectional view of a FinFET device structure taken along a z-plane (a horizontal plane containing the line D-D' in FIG. 2U) at an intermediate manufacturing step. As a result of the positioning of the z-plane for FIG. $2U_{zD}$, the blocking, cap, or plug structure 252 filing the wider upper opening portion 250a is revealed.

FIG. $2U_{zE}$ is a cross-sectional view of a FinFET device structure taken along a z-plane (a horizontal plane containing the line E-E' in FIG. 2U) at an intermediate manufacturing step. As a result of the positioning of the z-plane for FIG. $2U_{zE}$, the narrower lower opening portion 250b left by removing the first dummy layer 220, and the third sidewall layer 218 are revealed. In some embodiments, the ratio of the width of the lower opening portion 250b to the width of the third sidewall layer 218 will be adjusted by controlling the relative thicknesses of the first dummy layer 220 and the third sidewall layer 218 thereby providing a method for adjusting the resulting total capacitance.

FIG. 2V is a cross-sectional view of a FinFET device structure at an intermediate manufacturing step subsequent to that shown in FIG. 2U according to some embodiments. In FIG. 2V an etch stop layer 254 and a first IMD layer 256 are formed on the wafer. The etch stop layer and the first IMD layer 254, 256 are then patterned and etched to form contact openings that are subsequently filled with a metal, a plurality of metals, a metal alloy, and/or a metal silicide, or combinations thereof, to produce a source/drain contact 258 and a gate contact 260. In some embodiments, the source/drain contact 258 is not centered on and/or confined to the upper surface of the conductive vias 248, but will be offset and overlap a portion of SAC1 242 and, in some embodiments, a portion of the blocking, cap, or plug structure 252.

FIG. $2V_y$ is a cross-sectional view of a FinFET device structure taken along a y-plane at an intermediate manufacturing step corresponding to FIG. 2V (FIG. 2V being the default x-plane cross-sectional view). FIG. $2V_y$ illustrates structures not visible in FIG. 2V including the fin 219, the gate dielectric 231 formed on the fin, and the relationship between the fin 219 and the conductive fill layer 236.

FIG. $2V_{ZF}$ is a cross-sectional view of a FinFET device structure taken along a z-plane (a horizontal plane containing the line F-F' in FIG. $2V_y$) at an intermediate manufacturing step. As a result of the positioning of the z-plane for FIG. $2V_{ZF}$, the narrower lower opening portion 250b that remains after removing the first dummy layer 220, the third sidewall layer 218, and the gate contact 260 are revealed. In some embodiments, the ratio of the width of the lower opening portion 250b to the width of the third sidewall layer 218 will be adjusted by controlling the relative thicknesses of the first dummy layer 220 and the third sidewall layer 218 thereby providing a method for adjusting the resulting total capacitance. In some embodiments, a ratio of the thicknesses of the first dummy layer 220 and the third sidewall layer 218 will range between 1:3 and 3:1.

The methods according to the disclosure provided in at least FIGS. $2A-2V_{ZF}$ and the associated text will be successfully practiced without undue experimentation by those of ordinary skill in the art in accordance with the sequence of processes, operations, and materials detailed above. With respect to the seal material, both low-κ materials, including, for example, $SiO_2$, SiN, SiCN, SiC, SiOC, SiOCN, and mixtures thereof, (materials having a κ value no greater than 7), and high-κ materials including, for example, $HfO_2$, $ZrO_2$, $ZrAlO_x$, $HfAlO_x$, $HfSiO_x$, $Al_2O_3$, and mixtures thereof (materials having κ value greater than 7).

Similarly, the materials available for use in forming the plug structure 252 include a variety of silicon-based and germanium-based compounds including, for example Si, Ge, SiB, SiGeB, $SiO_2$, SiOC, and mixtures thereof. In some embodiments, the cap layer 238 will be a silicide (or salicide) material formed using one or more metals from the group consisting of Ni, Co, Ti, Ta, Pt, W, other noble metals, other refractory metals, rare earth metals, mixtures and alloys thereof, to produce a silicide layer of up to 10 nm. The conductive vias 248 will be formed using one or more metals from the group consisting of W, Ru, Co, Cu, Ti, TiN, Ta, TaN, Mo, Ni, and mixtures and alloys thereof at thicknesses of up to 50 nm. Similarly, the contact materials will be formed using one or more metals from a group consisting of W, Ru, Co, Cu, Ti, TiN, Ta, TaN, Mo, Ni, and mixtures and alloys thereof at thicknesses of up to 50 nm.

The dielectric fin material used in forming the third sidewall layer 218 will be selected from a variety of high-κ and low-κ materials. The acceptable high-κ materials include $HfO_2$, $ZrO_2$, $HfAlO_x$, $HfSiO_x$, $Al_2O_3$, and mixtures thereof, and acceptable low-κ materials include SiCN, SiOC, SiOCN, and mixtures thereof. In some embodiments, the dielectric fin material will have a bi-layer structure of dissimilar dielectric materials, the upper portion of the dielectric fin material will be a high-κ material while the lower portion of the dielectric fin material used in the third sidewall layer 218 will be a low-κ material.

The self-aligned contact layer 242 (SAC1) high-κ material will be selected from a variety of materials including, for example, $HfO_2$, $ZrO_2$, $HfAlO_x$, $HfSiO_x$, $Al_2O_3$, and mixtures thereof, and acceptable low-κ materials include SiCN, SiOC, SiOCN, and mixtures thereof (i.e., materials having a κ value less than 7. Similarly, the methods, procedures, and materials detailed above are also suitable for practicing dual self-aligned contacts (SAC), including both dual SAC and hybrid SAC embodiments.

Figure 3:
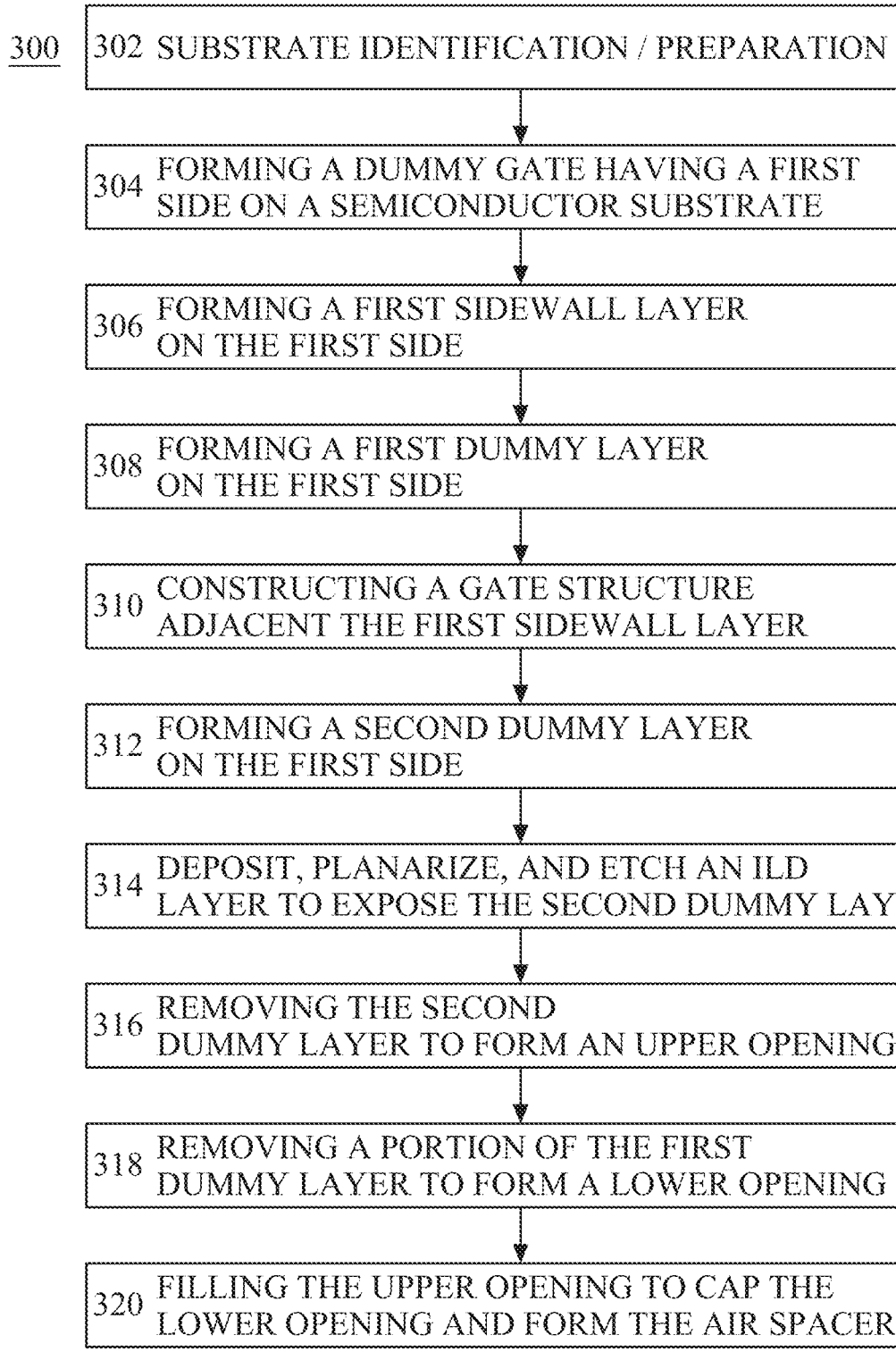
FIG. 3 is a flowchart of methods of manufacturing FinFET devices according to some embodiments.

FIG. 3 is a flowchart of a method 300 of manufacturing a FinFET device according to some embodiments. In some embodiments, operation 302 will include substrate identification/preparation steps including, e.g., damage/contamination inspection, doping verification, etc., washing, and other surface treatment(s) in order to prepare the wafer for the disclosed operations. Once the substrate is confirmed and prepared, in some embodiments a first surface of the substrate will be divided into a plurality of active areas or active regions (AR) that are separated by isolation regions using, for example, a shallow-trench isolation (STI) process or other suitable isolation method.

In some embodiments, during operation 304, a dummy layer, e.g., polysilicon, will be deposited on at least the active regions of the substrate. The dummy layer is then patterned, using a hard mask configured with one or more materials selected for the resistance to the subsequent etching processes, and etched to form an initial structure, the dummy gate. In some embodiments, operation 304 will produce a structure generally corresponding to the structures shown in FIG. 2A. In some embodiments the patterning operation(s) includes depositing a hard mask layer selected from oxides, nitrides, oxynitrides, and/or combinations thereof, forming a photoresist pattern on the hard mask layer(s), and removing the exposed portions of the hard mask layer(s) with a mask etch, thereby forming a hard mask pattern that is resistant to the etch process(es) that will subsequently be used for removing at least a portion of one or more underlying layer(s), e.g., the dummy layer.

Once the dummy gate is complete, in some embodiments the wafer is exposed to additional deposition processing for the purpose of forming a sidewall layer, operation 306, for protecting the vertical surfaces of the dummy gate and, in some embodiments, for controlling the spacing of the adjacent source/drain regions in the active region. The third sidewall layer 218 is formed using at least one material selected for suitability for downstream processing and that will exhibit an etch differential relative to other materials sufficient to preserve the sidewall structure through subsequent processing. In some embodiments, operation 306 will produce a structure generally corresponding to the structures shown in FIG. 2C. The first sidewall layer will be formed using a HK material such as $HfO_2$, $ZrO_2$, $HfAlO_x$, $HfSiO_x$ and $Al_2O_3$ (i.e., materials with a κ value of at least 7), a LK material such as SiCN, SiOC, SiOCN (i.e., materials with a κ value of less than 7), or a combination of both HK and LK materials. In some embodiments, a bi-layer first sidewall material will include an upper HK material layer and a lower LK material layer. Depending on the material selected, in some embodiments the sidewall layer will serve as an etch stop when removing subsequently deposited dummy layers.

Once the sidewall layer is in place, in some embodiments, a first dummy layer 220 is formed in operation 308 and will utilize one or more of a number of Si and/or Ge-based compounds including, for example, Si, SiB, SiGeB, $SiO_2$, SiOC, and mixtures thereof. In some embodiments, operation 308 will produce a structure generally corresponding to the structures shown in FIG. 2D. The material(s) selected for the first dummy layer 220 should show a strong etch preferential over the material(s) selected as the sidewall layer so, that when the dummy layer 220 is subsequently removed, there is little to no significant degradation or loss of the third sidewall layer 218 material. In some embodiments, the thickness of the first dummy layer defines the thickness of the air spacer.

Once the first dummy layer 220 is in place, in some embodiments, a gate structure, typically a MPG, is formed on the substrate adjacent the dummy gate structures in operation 310. In some embodiments, forming the MPG will include depositing a series of conductive layers, portions of which will be incorporated into a MPG structure. The conductive layers will include, for example, a BARC 230, a conductive sidewall layer 232, a conductive etch back layer 234, and a conductive fill layer 236. In some embodiments, upper portions of these conductive layers are then removed with the residual portions forming a MPG. In some embodiments, a conductive cap layer 238 is formed to cover the residual portions of the initial conductive layers 230, 232, 234, 236 to complete the formation of the MPG 229. In some embodiments, the steps in operation 308 will produce a series of structures generally corresponding to the structures shown in FIGS. 2L-2M.

Once the gate structure is in place, in some embodiments, a second dummy layer is formed in operation 312 utilizing a number of Si and/or Ge-based compounds including, for example, Si, SiB, SiGeB, $SiO_2$, SiOC, and mixtures thereof. In some embodiments, operation 312 will produce a structure generally corresponding to the structures shown in FIG. 2N. The horizontal portions of the second dummy layer 240 are then removed, e.g., etched back, to leave residual portions of the second dummy layer on the first dummy layer 220 and the third sidewall layer 218. In some embodiments, this portion of operation 312 will produce a structure generally corresponding to the structures shown in FIG. 2O. As with the first dummy layer, the material(s) selected for the second dummy layer should show a strong etch preferential over the material(s) selected as the third sidewall layer 218 so that the dummy layers 220, 240 will be readily removed without significant degradation of the material comprising the third sidewall layer 218. In some embodiments, the second dummy layer 240 is deposited at a larger thickness than the first dummy layer 220 and, in some embodiments, is sized to be as thick as the combination of the thicknesses of the first dummy layer 220 and the thickness of the third sidewall layer 218 in order to produce a two-zone opening. In some embodiments, the two-zone opening includes an upper zone with a larger opening for subsequently receiving and retaining the plug material and a lower zone comprising a somewhat narrower opening or spacing that remains after a portion of the first dummy layer has been removed. The opening provided in the lower zone defines the width of the air spacer.

Once the second dummy layer 240 is in place, in some embodiments, an ILD layer is deposited in the open space between two adjacent dummy gate structures at a thickness sufficient to fill the opening and to cover other structures in operation 314. In some embodiments, operation 314 will produce a structure generally corresponding to the structures shown in FIG. 2P, that after a CMP or other suitable planarization process, will produce a structure generally corresponding to the structures shown in FIG. 2Q. In some embodiments, after forming a mask and etching upper portions of the ILD layer exposed by the mask, the upper surfaces of the second dummy layer are exposed. In some embodiments, after these steps of operation 314 a structure generally corresponding to the structures shown in FIG. 2R will be produced in which the amount of material removed is greater in the more central portions of the mask opening.

In some embodiments, the residual portions of the second dummy layer are then removed during an etch program in operation 316. Removing the residual portions of the second dummy layer forms an opening that exposes the upper surface of the first dummy layer and, in some embodiments, at least a portion of the sidewall layer. In some embodiments, removing the residual portions of the second dummy layer exposes the upper surface of the first dummy layer and, in some embodiments, at least a portion of the sidewall layer In some embodiments, the residual portions of the first dummy layer are then removed during an etch program in operation 318. Removing the residual portions of the first dummy layer extends the opening formed by removing the second dummy layer in which, in some embodiments, the upper portion of the opening or recess is larger than the lower portion of the opening or recess. In some embodiments, the ratio of the thicknesses of the first dummy layer to the second dummy layer range from 1:1 to 1:3 and defines the width of the air spacer that is subsequently formed. In some embodiments, after these steps of operation 318 a structure generally corresponding to the structures shown in FIG. 2S will be produced in which a two-zone opening 250, having a larger upper portion and a more narrow lower portion, has been formed by removing the first and second dummy layers.

In some embodiments, the opening will then be capped in operation 320 with a seal material. The seal material will include, for example, at least one low-κ material and/or at least one high-κ material. The low-κ material(s) will be selected from a group including $SiO_2$, SiN, SiCN, SiC, SiOC, SiOCN, e.g., those materials with κ values no greater than 7 (κ≤7). While the high-κ material(s) will be selected from a group including, for example, $HfO_2$, $ZrO_2$, $ZrAlO_x$, $HfAlO_x$, $HfSiO_x$ and $Al_2O_3$, e.g., those materials with κ values of at least 7 (κ>7).

Figure 4:
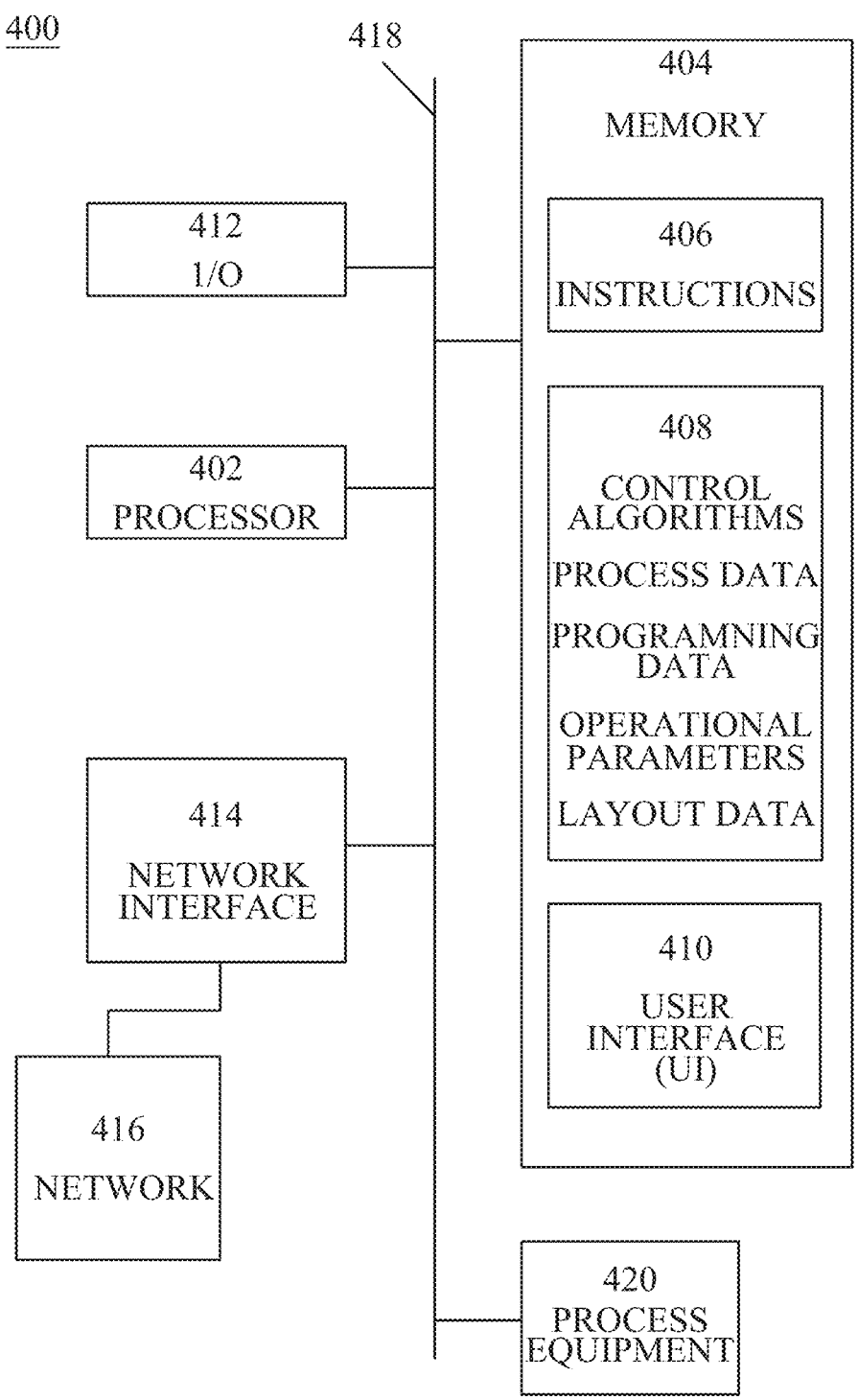
FIG. 4 is a schematic diagram of a system for manufacturing FinFET devices according to some embodiments.

FIG. 4 is a block diagram of an electronic process control (EPC) system 400, in accordance with some embodiments. Methods used for generating cell layout diagrams corresponding to some embodiments of the FinFET structures detailed above are implementable, for example, using EPC system 400, in accordance with some embodiments of such systems. In some embodiments, EPC system 400 is a general purpose computing device including a hardware processor 402 and a non-transitory, computer-readable, storage medium 404. Computer-readable storage medium 404, amongst other things, is encoded with, i.e., stores, computer program code (or instructions) 406, i.e., a set of executable instructions. Execution of computer program code 406 by hardware processor 402 represents (at least in part) an EPC tool which implements a portion or all of, e.g., the methods described herein in accordance with one or more (hereinafter, the noted processes and/or methods).

Hardware processor 402 is electrically coupled to computer-readable storage medium 404 via a bus 418. Hardware processor 402 is also electrically coupled to an I/O interface 412 by bus 418. A network interface 414 is also electrically connected to hardware processor 402 via bus 418. Network interface 414 is connected to a network 416, so that hardware processor 402 and computer-readable storage medium 404 are capable of connecting to external elements via network 416. Hardware processor 402 is configured to execute computer program code 406 encoded in computer-readable storage medium 404 in order to cause EPC system 400 to be usable for performing a portion or all of the noted processes and/or methods. In one or more embodiments, hardware processor 402 is a central processing unit (CPU), a multi-processor, a distributed processing system, an application specific integrated circuit (ASIC), and/or a suitable processing unit.

In one or more embodiments, computer-readable storage medium 404 is an electronic, magnetic, optical, electromagnetic, infrared, and/or a semiconductor system (or apparatus or device). For example, computer-readable storage medium 404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 404 includes a compact disk-read only memory (CD-ROM), a compact disk-read/write (CD-R/W), and/or a digital video disc (DVD).

In one or more embodiments, computer-readable storage medium 404 stores computer program code 406 configured to cause the EPC system 400 (where such execution represents (at least in part) the EPC tool) to be usable for performing a portion or all of the noted processes and/or methods. In one or more embodiments, computer-readable storage medium 404 also stores information that facilitates performing a portion or all of the noted processes and/or methods. In one or more embodiments, computer-readable storage medium 404 stores process control data 408 including, in some embodiments, control algorithms, process variables and constants, target ranges, set points, programming control data, and code for enabling statistical process control (SPC) and/or model predictive control (MPC) based control of the various processes.

EPC system 400 includes I/O interface 412. I/O interface 412 is coupled to external circuitry. In one or more embodiments, I/O interface 412 includes a keyboard, keypad, mouse, trackball, trackpad, touchscreen, and/or cursor direction keys for communicating information and commands to hardware processor 402.

EPC system 400 also includes network interface 414 coupled to hardware processor 402. Network interface 414 allows EPC system 400 to communicate with network 416, to which one or more other computer systems are connected. Network interface 414 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 400.

EPC system 400 is configured to send information to and receive information from fabrication tools 420 that include one or more of ion implant tools, etching tools, deposition tools, coating tools, rinsing tools, cleaning tools, chemical-mechanical planarizing (CMP) tools, testing tools, inspection tools, transport system tools, and/or thermal processing tools. These tools are then used for performing a predetermined series of manufacturing operations to produce the desired integrated circuit devices. The information being sent and/or received includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 404.

EPC system 400 is configured to receive information through I/O interface 412. The information received through I/O interface 412 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 402. The information is transferred to hardware processor 402 via bus 418. EPC system 400 is configured to receive information related to a user interface (UI) through I/O interface 412. The information is stored in computer-readable storage medium 404 as user interface (UI) 410.

In some embodiments, a portion or all of the noted processes and/or methods is/are implemented as a stand-alone software application for execution by a processor. In some embodiments, a portion or all of the noted processes and/or methods is/are implemented as a software application that is a part of an additional software application. In some embodiments, a portion or all of the noted processes and/or methods is/are implemented as a plug-in to a software application. In some embodiments, at least one of the noted processes and/or methods is/are implemented as a software application that is a portion of an EPC tool. In some embodiments, a portion or all of the noted processes and/or methods is/are implemented as a software application that is used by EPC system 400.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 5:
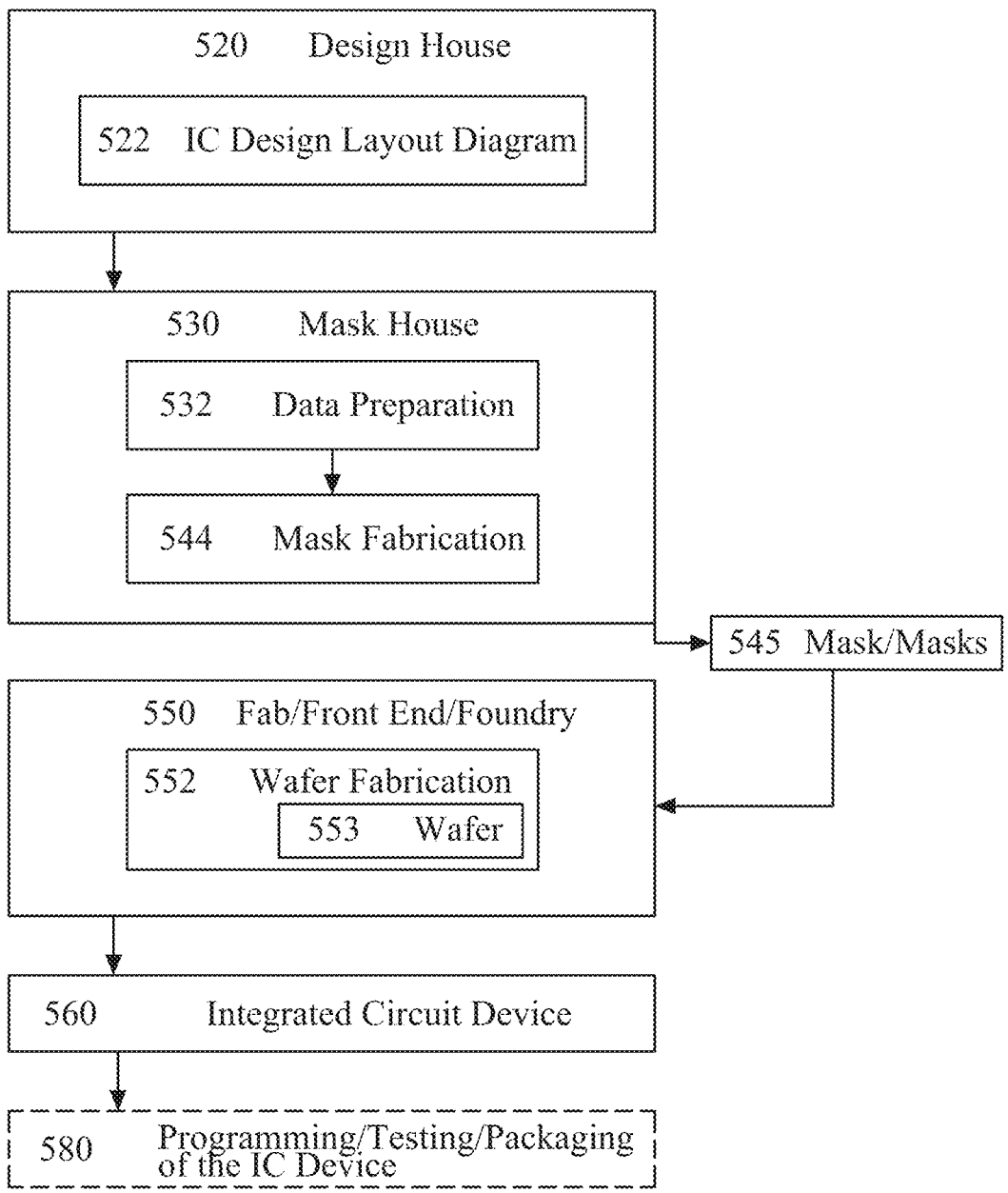
FIG. 5 is a flowchart of IC device design, manufacture, and programming of IC devices according to some embodiments.

FIG. 5 is a block diagram of an integrated circuit (IC) manufacturing system 500, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using IC manufacturing system 500.

In FIG. 5, IC manufacturing system 500 includes entities, such as a design house 520, a mask house 530, and an IC manufacturer/fabricator ("fab") 550, that interact with one another in the design, development, and manufacturing cycles and/or services related to manufacturing an IC device 560. Once the manufacturing process is complete and has formed a plurality of IC devices on a wafer, the wafer is optionally sent to backend or back end of line (BEOL) 580 for, depending on the device, programming, electrical testing, and packaging in order to obtain the final IC device products. The various entities comprising IC manufacturing system 500 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 520, mask house 530, and IC Fab 550, are owned by a single larger company. In some embodiments, two or more of design house 520, mask house 530, and IC Fab 550 coexist in a common facility and use common resources.

Design house (or design team) 520 generates an IC design layout diagram 522. IC design layout diagram 522 includes various geometrical patterns designed for an IC device 560. The geometrical patterns correspond to patterns of metal, oxide, or semiconductor layers that make up the various components of IC device 560 that is being fabricated. The various layers combine to form various IC features.

For example, a portion of IC design layout diagram 522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 520 implements a proper design procedure to form IC design layout diagram 522. The design procedure includes one or more of logic design, physical design or place and route. IC design layout diagram 522 is presented in one or more data files having information of the geometrical patterns. For example, IC design layout diagram 522 are expressed in a GDSII file format or DFII file format, in some embodiments.

In some embodiments, when the pattern of a modified IC design layout diagram is adjusted by an appropriate method in order to, for example, reduce parasitic capacitance of the integrated circuit as compared to an unmodified IC design layout diagram, the modified IC design layout diagram will reflect the results of changing the positions of conductive line(s) in the layout diagram. And, in some embodiments, the modified IC design layout diagram will reflect the insertion, into the IC design layout diagram, of features associated with capacitive isolation structures to further reduce parasitic capacitance, relative to IC structures having the modified IC design layout diagram without features for forming capacitive isolation structures located therein.

Mask house 530 includes mask data preparation 532 and mask fabrication 544. Mask house 530 uses IC design layout diagram 522 to manufacture one or more masks 545 to be used for fabricating the various layers of IC device 560 according to IC design layout diagram 522. Mask house 530 performs mask data preparation 532, where IC design layout diagram 522 is translated into a representative data file ("RDF"). Mask data preparation 532 provides the RDF to mask fabrication 544. Mask fabrication 544 includes a mask writer. A mask writer converts the RDF to an image on a substrate, such as a mask (reticle) 545 or a semiconductor wafer 553. The IC design layout diagram 522 is manipulated by mask data preparation 532 to comply with particular characteristics of the mask writer and/or requirements of IC Fab 550. In FIG. 5, mask data preparation 532 and mask fabrication 544 are illustrated as separate elements. In some embodiments, mask data preparation 532 and mask fabrication 544 are collectively referred to as mask data preparation, in some embodiments.

In some embodiments, mask data preparation 532 includes optical proximity correction (OPC) which uses lithography enhancement techniques to compensate for image errors, such as those that arise from diffraction, interference, other process effects and the like. OPC adjusts IC design layout diagram 522. In some embodiments, mask data preparation 532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 532 includes a mask rule checker (MRC) that checks the IC design layout diagram 522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 522 to compensate for limitations during mask fabrication 544, which undoes part of the modifications performed by OPC in order to meet mask creation rules.

In some embodiments, mask data preparation 532 includes lithography process checking (LPC) that simulates processing that will be implemented by IC Fab 550 to fabricate IC device 560. LPC simulates this processing based on IC design layout diagram 522 to create a simulated manufactured device, such as IC device 560. The processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 522.

It should be understood that the above description of mask data preparation 532 has been simplified for the purposes of clarity. In some embodiments, mask data preparation 532 includes additional features such as a logic operation (LOP) to modify the IC design layout diagram 522 according to manufacturing rules. Additionally, the processes applied to IC design layout diagram 522 during mask data preparation 532 are executed in a variety of different orders.

After mask data preparation 532 and during mask fabrication 544, a mask 545 or a group of masks 545 is/are fabricated based on the modified IC design layout diagram 522. In some embodiments, mask fabrication 544 includes performing one or more lithographic exposures based on IC design layout diagram 522. In some embodiments, an electron-beam (e-beam) or a mechanism of multiple e-beams is used to form a pattern on a mask (photomask or reticle) 545 based on the modified IC design layout diagram 522. Mask 545 are formed in various technologies. In some embodiments, mask 545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 545 includes a transparent substrate (e.g., fused quartz) and an opaque material (e.g., chromium) coated in the opaque regions of the binary mask.

In another example, mask 545 is formed using a phase shift technology. In a phase shift mask (PSM) version of mask 545, various features in the pattern formed on the phase shift mask are configured to have proper phase difference to enhance the resolution and imaging quality. In various examples, the phase shift mask is attenuated PSM or alternating PSM. The mask(s) generated by mask fabrication 544 is used in a variety of processes. For example, such a mask(s) is used in an ion implantation process to form various doped regions in semiconductor wafer 553, in an etching process to form various etching regions in semiconductor wafer 553, and/or in other suitable processes. IC Fab 550 includes wafer fabrication 552. IC Fab 550 is an IC fabrication business that includes one or more manufacturing facilities for the fabrication of a variety of different IC products. In some embodiments, IC Fab 550 is a semiconductor foundry. For example, there are a manufacturing facility for the front end fabrication of a plurality of IC products (front-end-of-line (FEOL) fabrication), while a second manufacturing facility provides the back end fabrication for the interconnection and packaging of the IC products (back-end-of-line (BEOL) fabrication), and a third manufacturing facility provides other services for the foundry business.

Wafer fabrication 552 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 545 include a single layer of mask material. In some embodiments, a mask 545 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC Fab 550 uses mask(s) 545 fabricated by mask house 530 to fabricate IC device 560. Thus, IC Fab 550 at least indirectly uses IC design layout diagram 522 to fabricate IC device 560. In some embodiments, semiconductor wafer 553 is fabricated by IC Fab 550 using mask(s) 545 to form IC device 560. In some embodiments, the IC fabrication includes performing one or more lithographic exposures based at least indirectly on IC design layout diagram 522. Semiconductor wafer 553 includes a silicon substrate or other proper substrate having material layers formed thereon. Semiconductor wafer 553 further includes one or more of various doped regions, dielectric features, multi-level interconnects, and the like (formed at subsequent manufacturing steps).

Figure 6:
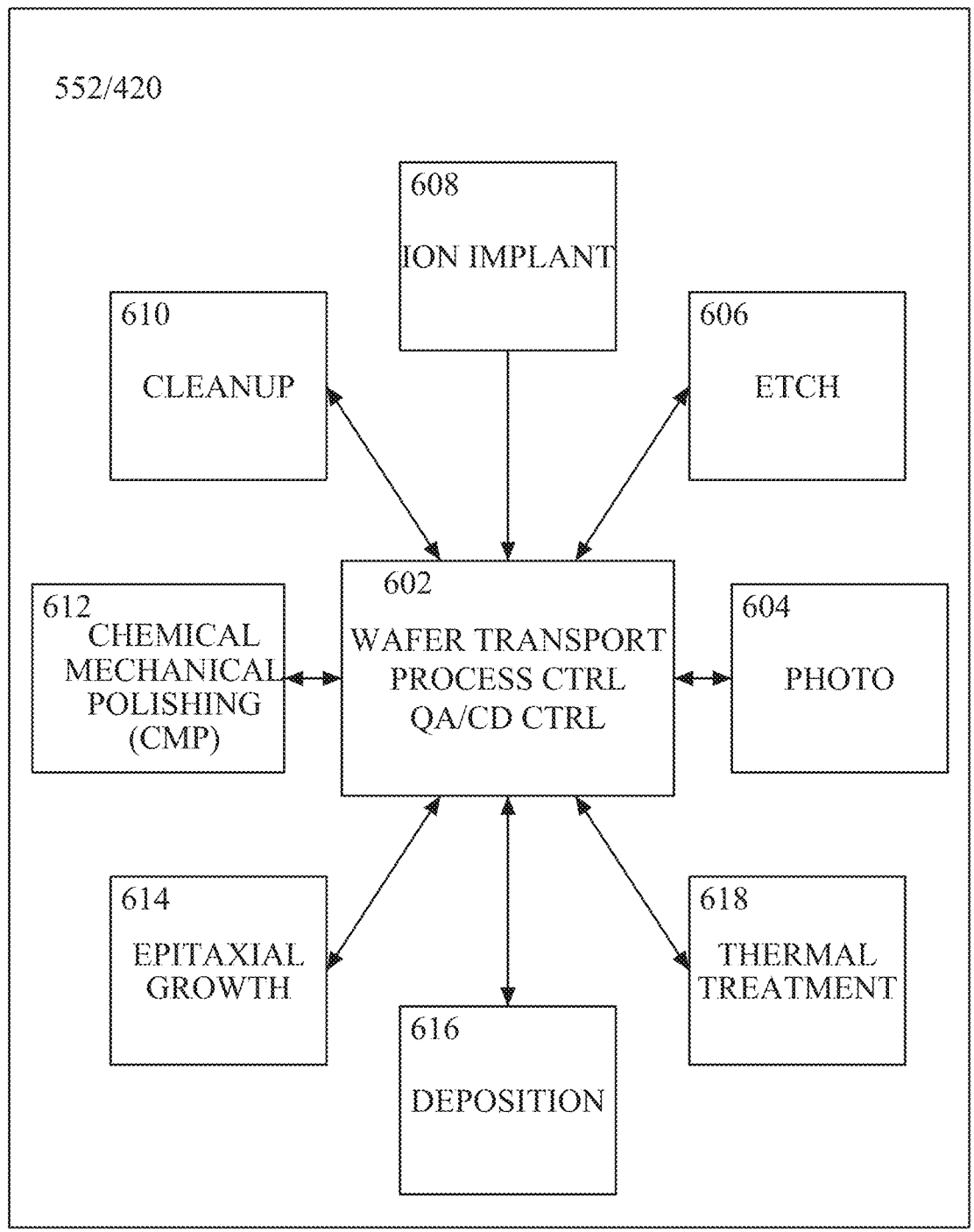
FIG. 6 is a schematic diagram of a processing system for manufacturing FinFET devices according to some embodiments.

FIG. 6 is a schematic diagram of various processing departments defined within a Fab/Front End/Foundry configured for manufacturing IC devices according to some embodiments as suggested in FIG. 4, specifically in blocks 408 and 420 and FIG. 5, specifically in block 552. The processing departments utilized in front end of line (FEOL) IC device manufacturing typically include a wafer transport operation 602 for moving and/or staging the wafers between the various processing departments. In some embodiments, the wafer transport operation will be integrated with an electronic process control (EPC) system according to FIG. 4 and utilized for providing process control operations, ensuring that the wafers are being both processed in a timely manner and sequentially delivered to the appropriate processing departments as determined by the corresponding process flow.

In some embodiments, the EPC system will also provide control and/or quality assurance and parametric data for the proper operation of the defined processing equipment. In some embodiments of semiconductor manufacturing facilities, various processing departments will be interconnected by the wafer transport operation 602 which is configured for delivering the wafers to the appropriate department. These departments include, for example, photolithographic operations 604 during which a photoresist is applied, exposed, and developed, etch operations 606 in variously configured equipment applies a wet and/or dry etchant to the wafer to remove at least a portion of one or more of the materials found on the wafer, and ion implant operations 608 for adjusting the doping and/or the crystal morphology of selected regions of the wafer.

Additional departments will include clean-up/strip operations 610 for removing photoresist and/or other contaminants or debris, chemical mechanical polishing (CMP) operations 612 for removing upper portions of one or more materials to provide a more planar surface suitable for additional processing, epitaxial growth operations 614 for depositing/growing addition materials in selected regions of the wafer, deposition operations 616 for depositing new layers of one or more materials on the surface of the wafer, and thermal treatments 618 for growing new material layers, e.g., oxide or nitride, mitigating implant damage, and/or altering the dopant profiles in regions within the wafer.

Additional details regarding integrated circuit (IC) manufacturing systems and an IC manufacturing flows associated therewith are found, e.g., in U.S. Pat. No. 9,256,709, granted Feb. 9, 2016, U.S. Pre-Grant Publication No. 2015/0278429, published Oct. 1, 2015, U.S. Pre-Grant Publication No. 2014/0040838, published Feb. 6, 2014, and U.S. Pat. No. 7,260,442, granted Aug. 21, 2007, each of which are hereby incorporated, in their entireties, by reference.

Certain relevant dimensions are marked in FIG. 7A, FIG. 7By (FIG. 7By is a y-plane vertical cross-section of the FinFET device shown in FIG. 7A along the plane including the line F-F'), and FIG. $7C_{ZF}$ (FIG. $7C_{ZF}$ is a horizontal z-plane cross-section of the FinFET device shown in FIG. 7A along the plane including the line F-F') including air spacer width (1), air spacer depth (2), seal material thickness (3), seal material width (4), metal gate height (MG_H) (5), self-aligned contact material height (SAC1_Height) (6), L-shaped low-κ (LK) spacer thickness (7), cut metal gate (CMG) width (8), FinFET fin width (9), active region (AR) to AR spacing (10), seal material width (11), and the number of nanosheet pairs in those embodiments in which a unitary fin construction is replaced by a plurality of nanosheets.

Target ranges for these relevant dimensions using current designs and manufacturing processes include the values provided in TABLE 1 below.

TABLE 1

| Dimension (Designator) | Range |
| --- | --- |
| Air Spacer Width (1) | 0.5-6.0 nm |
| Air Spacer Depth (2) | 4-36 nm |
| Seal Material Thickness (3) | 2-10 nm |
| Seal Material Width (4) | 1-7 nm |
| Metal Gate Height (MG_H) (5) | 4-20 nm |
| Self-Aligned Contact Material Height (SAC1_Height) (6) | 4-26 nm |
| L-Shaped Low K (LK) Spacer Thickness (7) | 0.1-4.0 nm |
| Cut Metal Gate (CMG) Width (8) | 6-40 nm |
| Fin Width (9) | 6-36 nm |
| Active Region (AR) to AR Spacing (10) | 20-46 nm |
| Seal Material Width (11) | 1-7 nm |
| Number of Nanosheet Pairs | 3-8 |

Departures from the target values for these dimensions will tend to degrade the yield, performance, and/or reliability for the resulting IC devices. For example, variations in the air spacer width (1) will affect the capacitance of the gates and variations in the gate capacitance will result in undesirable variation in the switching speeds of the affected transistors, variations in the air spacer depth (2) will affect the capacitance of the gates and variations in the gate capacitance will result in undesirable variation in the switching speeds of the affected transistors, variations in the seal material thickness (3) will affect the durability of the seal and, in some embodiments, lead to undesirable variations in the air spacer depth (2), variations in the seal material width (4) and (11), will affect coverage of the sidewall layer and interfere with the deposition of subsequent layers, variations in the metal gate height (MG_H) (5) will result in undesirable variation in the current flow achieved by the affected transistors and variations in the gate capacitance will result in undesirable variation in the switching speeds of the affected transistors. Further, variations in the self-aligned contact material height (SAC1_Height) (6) will result in coverage issues, complicate processing, or lead to the presence of voids in the film, variations in the L-shaped low-κ (LK) spacer thickness (7) will affect the capacitance of the gates and variations in the gate capacitance will result in undesirable variation in the switching speeds of the affected transistors, variations in the cut metal gate (CMG) width (8) will affect the gate current and gate capacitance which will result in undesirable variation in the performance of the affected transistors, variations in the FinFET fin width (9) will affect the gate current and gate capacitance which will result in undesirable variation in the performance of the affected transistors, variations in the active region (AR) to AR spacing (10) will affect the degree of isolation which will result in undesirable variation in the leakage current of the affected transistors. Further, variations in the number of nanosheets used to replace the fin structure will complicate the processing if an excessive number of nanosheets are used and will not take full advantage of the nanosheet structures an insufficient number of nanosheets are used. In general, variations in and/or departures from the target ranges of the parametric, dimensional, and/or relational values defined for a particular set of design rules and/or manufacturing process, will negatively affect the yield, reliability, and/or performance of the resulting semiconductor devices.

In some embodiments, a semiconductor device is manufactured using a method including the operations of forming a first dummy gate and a second dummy gate on a semiconductor substrate, depositing a sidewall layer on the first and second dummy gates, depositing a first dummy spacer layer on the sidewall layer, depositing a first interlayer dielectric (ILD) layer on the first dummy spacer layer, removing upper portions of the first ILD layer, the first dummy spacer layer, and the sidewall layer, to form residual portions of the first ILD layer, residual portions of the first dummy spacer layer, and residual portions of the sidewall layer, removing first portions of the first and second dummy gates to form first and second residual dummy gates, removing portions of the residual portions of the first dummy spacer layer to form first dummy spacers having a first height DSH1 and a first width DSW1 and the residual portions of the sidewall layer to form sidewalls having a sidewall height SWH1 and a sidewall width SWW1, wherein top surfaces of the residual dummy gate, first dummy spacers, and sidewalls are coplanar, removing the first and second residual dummy gates to open exposed regions of the semiconductor substrate, constructing a gate structure on the exposed regions of the semiconductor substrate and between the sidewalls, the gate structure having a height GSH1, wherein GSH1<SWH1, depositing a second dummy layer, removing a first portion of the second dummy layer to form second dummy spacers on the first dummy spacers, the second dummy spacers having a second dummy spacer height DSH2 and a second dummy spacer width DSW2, depositing a first self-aligned contact layer (SAC1), removing an upper portion of the SAC1 to expose upper surfaces of the residual portions of the first ILD layer, removing the residual portions of the first ILD layer and an additional portion of the SAC1 to expose upper surfaces of the second dummy spacers, removing the second dummy spacers to define an upper recess having an upper recess depth URD1 and an upper recess width URW1, and to expose an upper surface of the first dummy spacer, removing the first dummy spacer layer to define a lower recess having a lower recess depth LRD1 and a lower recess width LRW1; and forming a plug in the upper recess to cap the lower recess and define an air spacer, the air spacer having a spacer depth SPD1 and a spacer width SPW1.

Some other embodiments will satisfy one or more expressions (or conditions) including, for example, the expressions

SPD1≥GSH1, DSW2>DSW1, SWH1>DSH1, DSW2≥DSW1+SWW1, URW1≥LRW1.

Some other embodiments will include one or more additional operations including, for example, the operations of configuring the residual portions of the first dummy spacer layer as an etch back mask to protect predetermined lateral portions of the residual portions of the sidewall layer, terminating the removal of the second dummy spacers when the upper surfaces of the sidewalls are exposed (the sidewalls serving as an etch stop surface of the second dummy spacer removal, constructing the gate structure includes forming a multi-pattern gate (MPG) structure, in some embodiments the MPG structure includes at least two layers selected from a group including backside anti-reflection coatings (BARC), conductive sidewall layers, conductive etch back layers, conductive fill layers, and a conductive capping layer.

In some embodiments, a semiconductor device is manufactured using a method including at least the operations of forming a dummy gate extending over a fin structure, depositing a sidewall layer along sidewalls of the dummy gate, depositing a first dummy layer on the sidewall layer, removing the dummy gate, depositing a multi-pattern gate (MPG) in the region left vacant by the dummy gate removal, depositing a second dummy layer over the first dummy layer, removing the first dummy layer and the second dummy layer to define an opening, wherein an upper portion of the opening has a first width and a lower portion of the opening has a second width, and further wherein the second width is less than the first width, and depositing a sealing material in the upper portion of the opening to form a cap that defines an upper bound of an air spacer.

Some other embodiments will satisfy one or more conditions including, for example, ensuring that the height of the MPG is less than the height of the lower portion of the opening and/or that the sidewall layer etch rate is no more than 20% of the first dummy spacer etch rate under the same etch conditions.

Some other embodiments will include one or more additional operations including, for example, depositing a conductive cap layer over the MPG, forming a source/drain region adjacent and laterally spaced from the MPG, forming a via structure on the source/drain region, depositing an intermetallic dielectric (IMD) layer over the via structure, and forming a contact through the IMD layer to an upper surface of the via structure, and selecting the sidewall layer material from a group including Si, Ge, SiB, SiGeB, SiO2, SiOC, and mixtures or combinations of these materials. In some embodiments, the contact extends beyond the via structure to an upper surface of the sidewall layer.

In some embodiments, the final semiconductor device structure includes a multi-pattern gate (MPG) structure having a gate structure height GSH1, a sidewall layer formed on at least two sides of the gate structure, an air spacer formed adjacent the MPG structure, the air spacer having a height ASH1 and a width ASW1, and a cap structure sealing the air spacer, the cap having a height CH1 and a width CW1, in which expressions ASH1>GSH1 and CW1>ASW1 are satisfied. In some embodiments, the multi-pattern gate (MPG) structure will be a metal gate structure and/or the sidewall will have a vertical portion and a horizontal portion extending from a lower portion of vertical portion, forming an "L-shape" structure wherein the horizontal portion extends across and defines a lower bound of the air spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of some embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor device comprising:

forming a first dummy gate and a second dummy gate on a semiconductor substrate;

depositing a sidewall layer on the first and second dummy gates;

depositing a first dummy spacer layer on the sidewall layer;

depositing a first interlayer dielectric (ILD) layer on the first dummy spacer layer;

removing upper portions of the first ILD layer, the first dummy spacer layer, and the sidewall layer, to form residual portions of the first ILD layer, residual portions of the first dummy spacer layer, and residual portions of the sidewall layer;

removing first portions of the first and second dummy gates to form first and second residual dummy gates;

removing portions of the residual portions of the first dummy spacer layer to form first dummy spacers having a first height $DS_{H1}$ and a first width $DS_{W1}$ and the residual portions of the sidewall layer to form sidewalls having a sidewall height $SW_{H1}$ and a sidewall width $SW_{W1}$, wherein top surfaces of the first and second residual dummy gates, first dummy spacers, and sidewalls are coplanar;

removing the first and second residual dummy gates to open exposed regions of the semiconductor substrate;

constructing a gate structure on the exposed regions of the semiconductor substrate and between the sidewalls, the gate structure having a height $GS_{H1}$, wherein $GS_{H1}<SW_{H1}$;

depositing a second dummy layer;

removing a first portion of the second dummy layer to form second dummy spacers on the first dummy spacers, the second dummy spacers having a second dummy spacer height DSH2 and a second dummy spacer width $DS_{W2}$;

depositing a first self-aligned contact layer (SAC1);

removing an upper portion of the SAC1 to expose upper surfaces of the residual portions of the first ILD layer;

removing the residual portions of the first ILD layer and an additional portion of the SAC1 to expose upper surfaces of the second dummy spacers;

removing the second dummy spacers to define an upper recess having an upper recess depth $UR_{D1}$ and an upper recess width $UR_{W1}$, and to expose an upper surface of the first dummy spacer;

removing the first dummy spacers to define a lower recess having a lower recess depth $LR_{D1}$ and a lower recess width $LR_{W1}$; and forming a plug in the upper recess to cap the lower recess and define an air spacer, the air spacer having a spacer depth $SP_{D1}$ and a spacer width $SP_{W1}$.

2. The method of claim 1, wherein:

an expression $SP_{D1} \geq GS_{H1}$ is satisfied.

3. The method of claim 1, wherein:
an expression $DS_{W2} > DS_{W1}$ is satisfied.
4. The method of claim 1, wherein:
an expression $SW_{H1} > DS_{H1}$ is satisfied.
5. The method of claim 1, wherein:
an expression $DS_{W2} \geq DS_{W2} + SW_{W1}$ is satisfied.
6. The method of claim 1, wherein:
an expression $UR_{W1} \geq LR_{W1}$ is satisfied.
7. The method of claim 1, further comprising:
configuring the residual portions of the first dummy spacer layer as an etch back mask to protect predetermined horizontal portions of the residual portions of the sidewall layer.
8. The method of claim 1, wherein:
removing the second dummy spacers is terminated when upper surfaces of the sidewalls are exposed.
9. The method of claim 1, wherein:
constructing the gate structure comprises forming a multi-pattern gate (MPG) structure.
10. The method of claim 9, wherein:
forming the MPG structure comprises, in sequence,
depositing a backside anti-reflection coating (BARC);
depositing a conductive sidewall layer;
depositing a conductive etch back layer; and
depositing a conductive fill layer.
11. A method of manufacturing a semiconductor device comprising:
forming a dummy gate extending over a fin structure;
depositing a sidewall layer along sidewalls of the dummy gate;
depositing a first dummy layer on the sidewall layer;
removing the dummy gate;
depositing a multi-pattern gate (MPG);
depositing a second dummy layer over the first dummy layer, the second dummy layer being formed to have a first width, and the first dummy layer being formed to have a second width that is less than the first width;
entirely removing the first and second dummy layers to define an opening, wherein an upper portion of the opening has the first width and a lower portion of the opening has the second width; and
depositing a sealing material in the upper portion of the opening to form a cap defining an upper bound of an air spacer.
12. The method of claim 11, wherein:
the MPG has a first height, and
the lower portion of the opening has a second height, the second height being larger than the first height.
13. The method of claim 11, further comprising:
depositing a conductive cap layer over the MPG.
14. The method of claim 13, further comprising:
forming a source/drain region adjacent and spaced from the MPG;
forming a via structure on the source/drain region;
depositing an intermetallic dielectric (IMD) layer over the via structure; and
forming a contact through the IMD layer to an upper surface of the via structure.
15. The method of claim 14, wherein:
the contact extends beyond the via structure to an upper surface of the sidewall layer.
16. The method of claim 11, further comprising:
selecting the first dummy layer with a first etch rate; and
selecting the sidewall layer with a second etch rate, wherein a ratio of the first etch rate and the second etch rate is no higher than 1:5.
17. The method of claim 16, further comprising:
selecting the sidewall layer from the group consisting of Si, Ge, SiB, SiGeB, $SiO_2$, SiOC, and mixtures thereof.
18. A method of manufacturing a semiconductor device comprising:
forming a multi-pattern gate (MPG) structure having a gate structure height $GS_{H1}$ and a gate structure width $GS_{W1}$;
forming a first sidewall structure on a first vertical side and a second sidewall structure on a second vertical side of the MPG structure;
forming an air spacer adjacent each of the first and second sidewall structures, wherein the air spacers have a height $AS_{H1}$ and a width $AS_{W1}$; and
sealing each of the air spacers with a cap structure, wherein the cap structures have a height $C_{H1}$ and a width $C_{W1}$ and further wherein a first expression $AS_{H1} > GS_{H1}$, a second expression $C_{W1} > AS_{W1}$, and a third expression $GS_{W1} > C_{W1}$ are satisfied.
19. The method of claim 18, wherein:
forming the MPG structure comprises forming a metal gate structure.
20. The method of claim 18, wherein:
forming at least one of the first sidewall structure or the second sidewall structure comprises:
forming a vertical sidewall portion adjacent the MPG structure; and
forming a horizontal sidewall portion extending from a lower portion of the vertical sidewall portion, wherein the horizontal sidewall portion defines a lower bound of the air spacer, and
forming the air spacers comprises removing a dummy layer, wherein:
the dummy layer is selected to have a first etch rate; and
the vertical and horizontal sidewall portions are selected to have a second etch rate, wherein a ratio of the first etch rate and the second etch rate is no higher than 1:5.

* * * * *